United States Patent [19]
Shinriki et al.

[11] Patent Number: 6,143,081
[45] Date of Patent: Nov. 7, 2000

[54] FILM FORMING APPARATUS AND METHOD, AND FILM MODIFYING APPARATUS AND METHOD

[75] Inventors: Hiroshi Shinriki, Matsudo; Masahito Sugiura, Nirasaki, both of Japan

[73] Assignee: Tokyo Electron Limited, Tokyo, Japan

[21] Appl. No.: 08/889,590

[22] Filed: Jul. 8, 1997

[30] Foreign Application Priority Data

| Jul. 12, 1996 | [JP] | Japan | 8-203253 |
| Jul. 12, 1996 | [JP] | Japan | 8-203254 |
| Jul. 12, 1996 | [JP] | Japan | 8-203255 |
| May 2, 1997 | [JP] | Japan | 9-130258 |
| May 2, 1997 | [JP] | Japan | 9-130259 |
| May 2, 1997 | [JP] | Japan | 9-130260 |

[51] Int. Cl.$^7$ .................................................. C23C 16/00
[52] U.S. Cl. .................... 118/719; 118/715; 118/722; 118/723 ME; 118/723 IR; 118/725
[58] Field of Search .................... 118/719, 722, 118/725, 715, 723 ME, 723 IR

[56] References Cited

U.S. PATENT DOCUMENTS

| 4,540,466 | 9/1985 | Nishizawa | 156/643 |
| 4,597,986 | 7/1986 | Scrapple | 427/53.1 |
| 4,687,544 | 8/1987 | Bersen | 156/345 |
| 4,716,852 | 1/1988 | Tsujii | 118/715 |

FOREIGN PATENT DOCUMENTS

| 2-283022 | 11/1990 | Japan . |
| 5-247650 | 9/1993 | Japan . |

*Primary Examiner*—Richard Bueker
*Attorney, Agent, or Firm*—Oblon, Spivak, McClelland, Maier & Neustadt, P.C.

[57] ABSTRACT

A film forming/modifying system includes a film forming apparatus which has an alcohol supply unit and forms a metal oxide film on a semiconductor wafer in a vacuum atmosphere in which a vaporized metal oxide film material and a vaporized alcohol exist, a film modifying apparatus which has a UV irradiation unit for irradiating a UV ray on ozone to generate active oxygen atoms, and modifies the metal oxide film by exposing the metal oxide film to the active oxygen atoms in a vacuum atmosphere, and a common transfer chamber commonly coupled to the film forming apparatus and the film modifying apparatus to transfer the target process object between the film forming apparatus and the film modifying apparatus while maintaining the vacuum state.

38 Claims, 19 Drawing Sheets

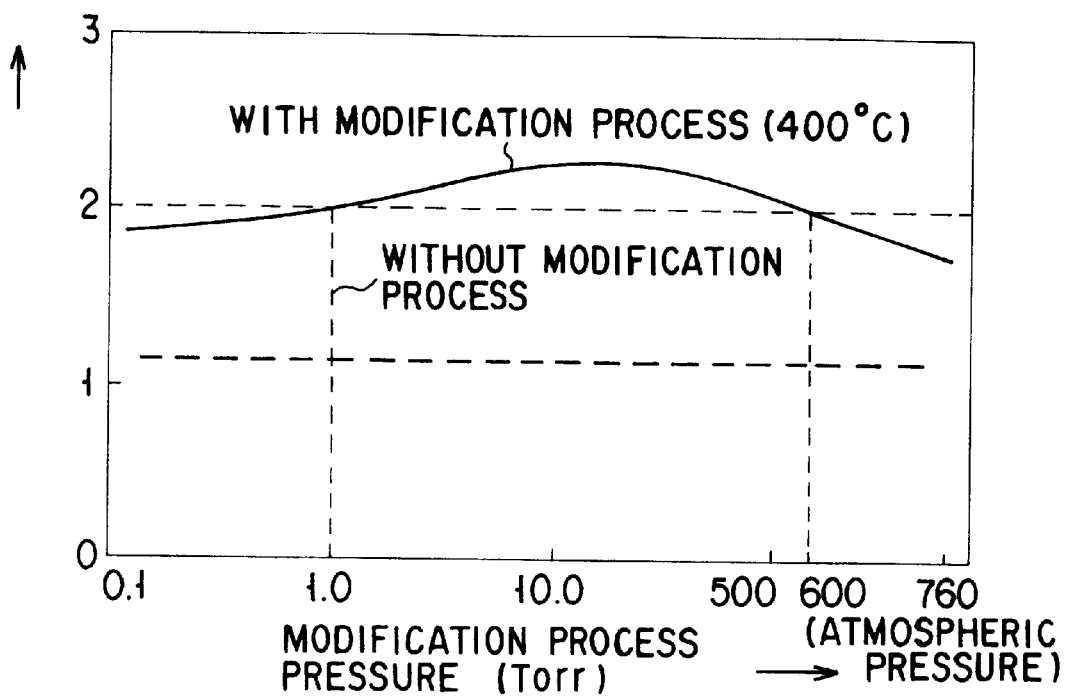
F I G. 11
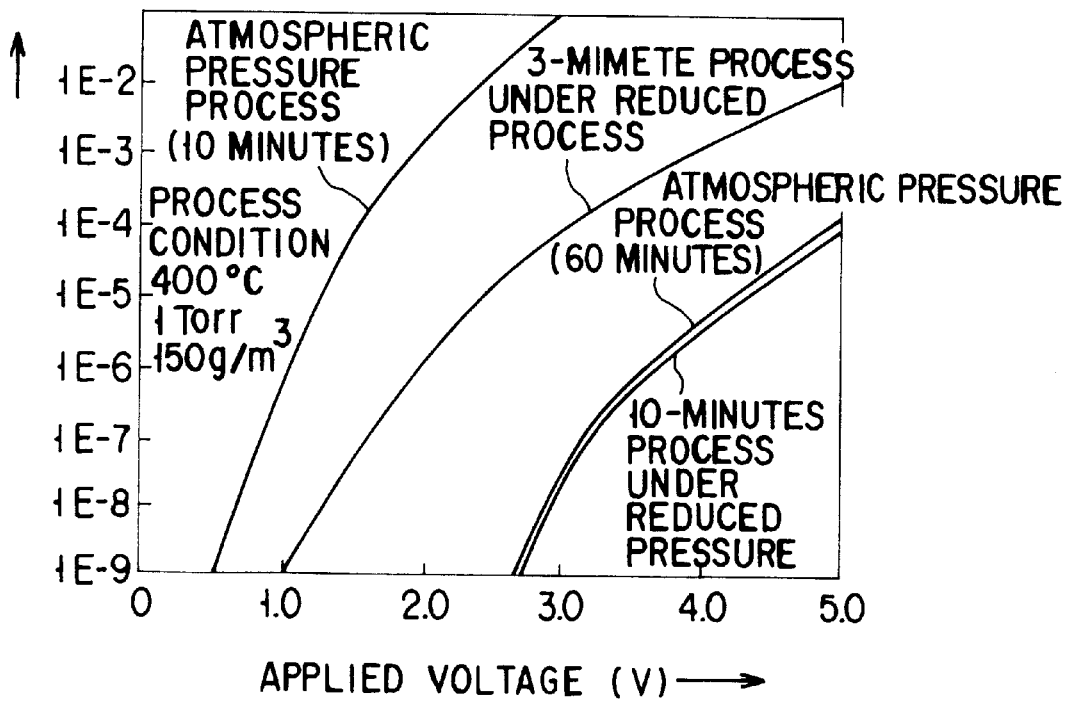
F I G. 12

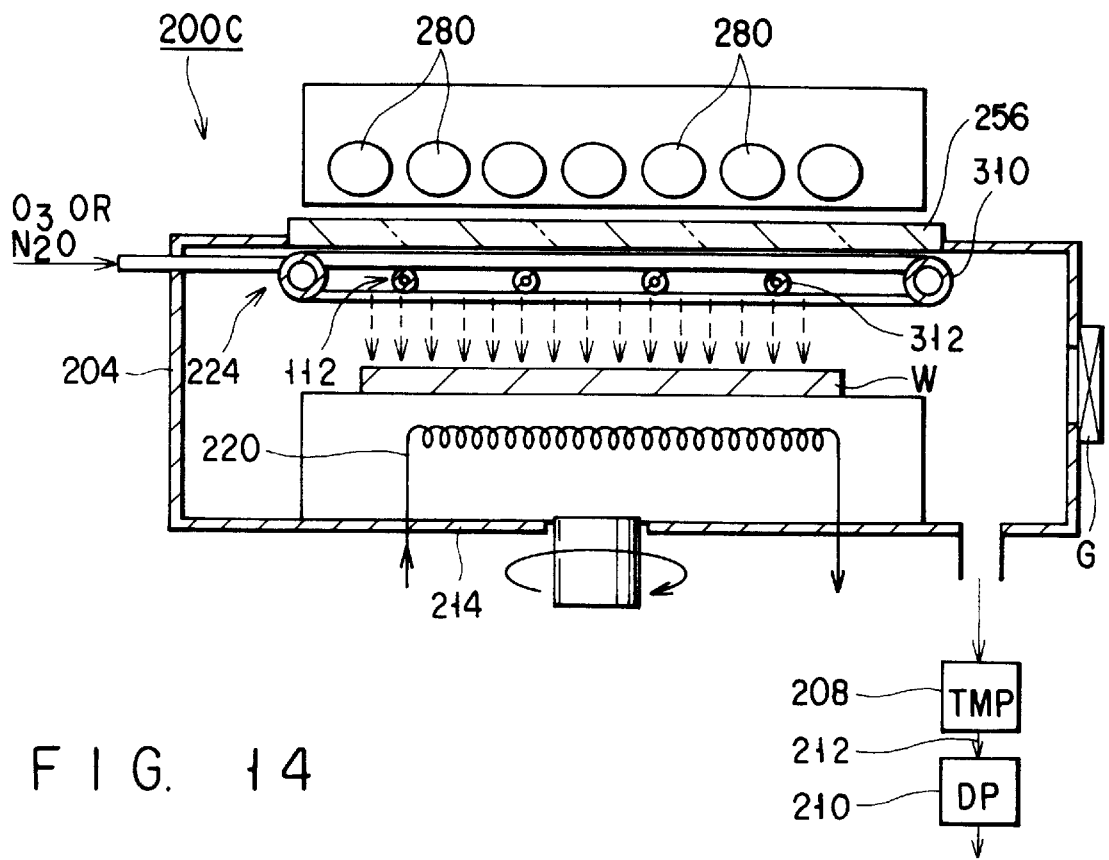
F I G. 14
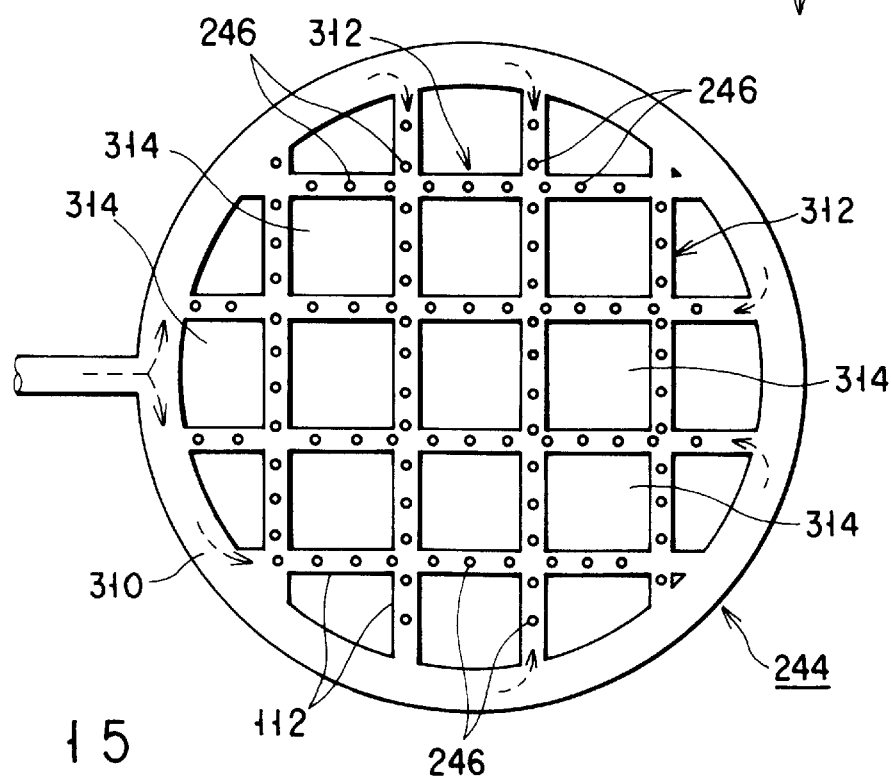
F I G. 15

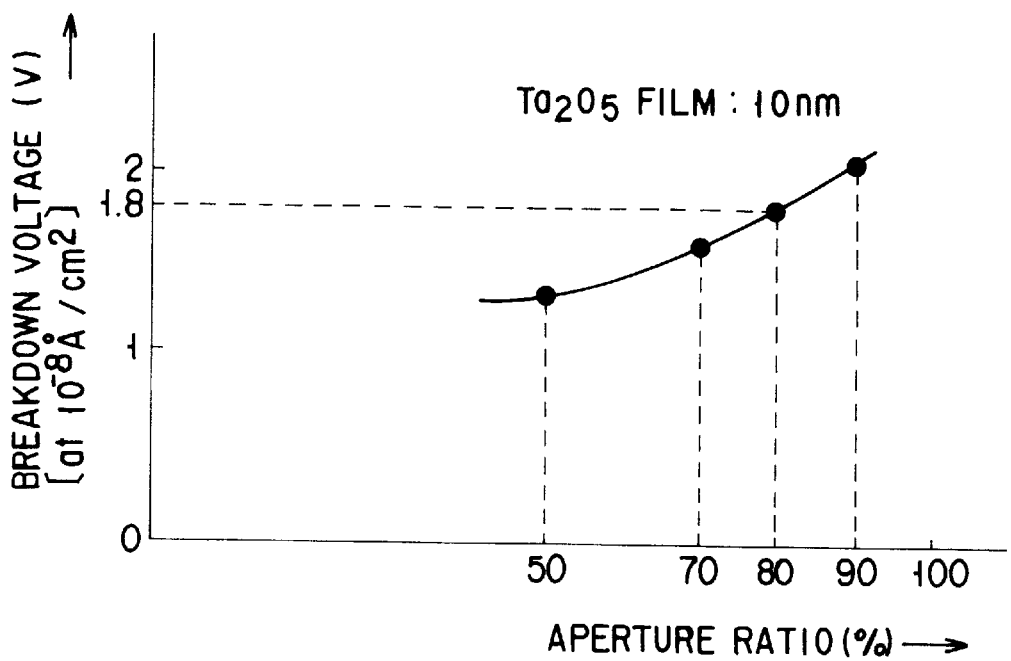
F I G. 16
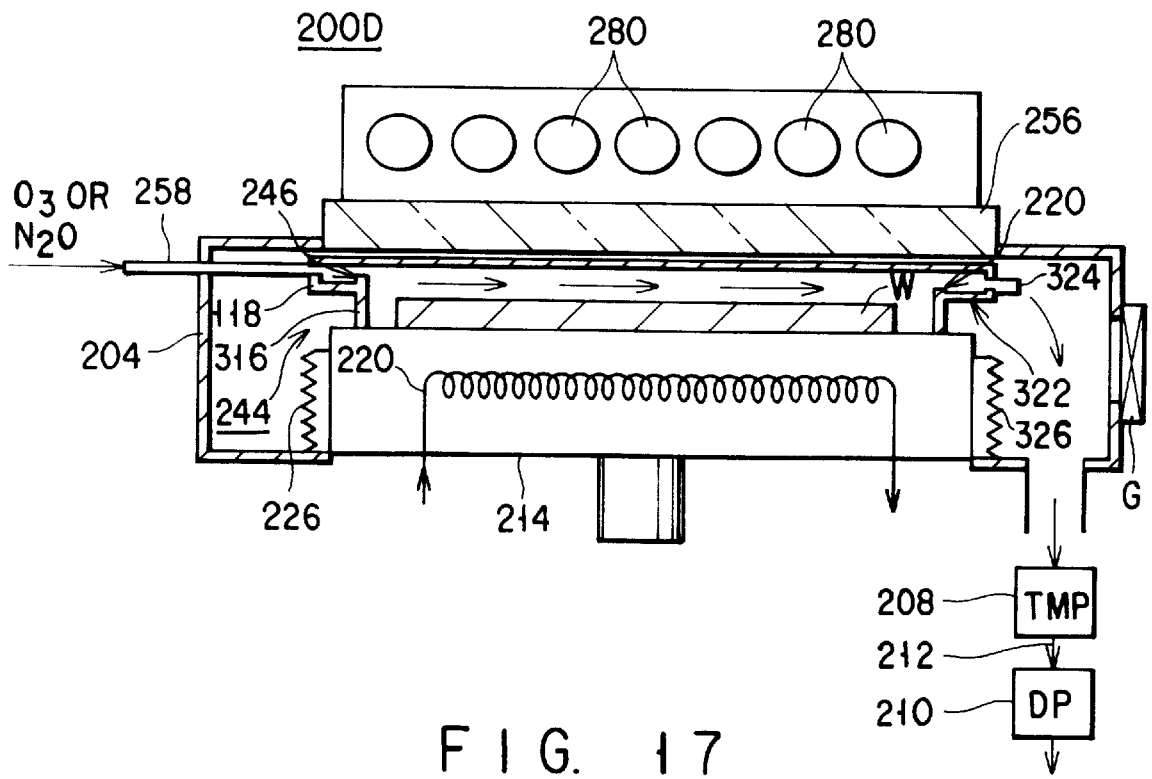
F I G. 17

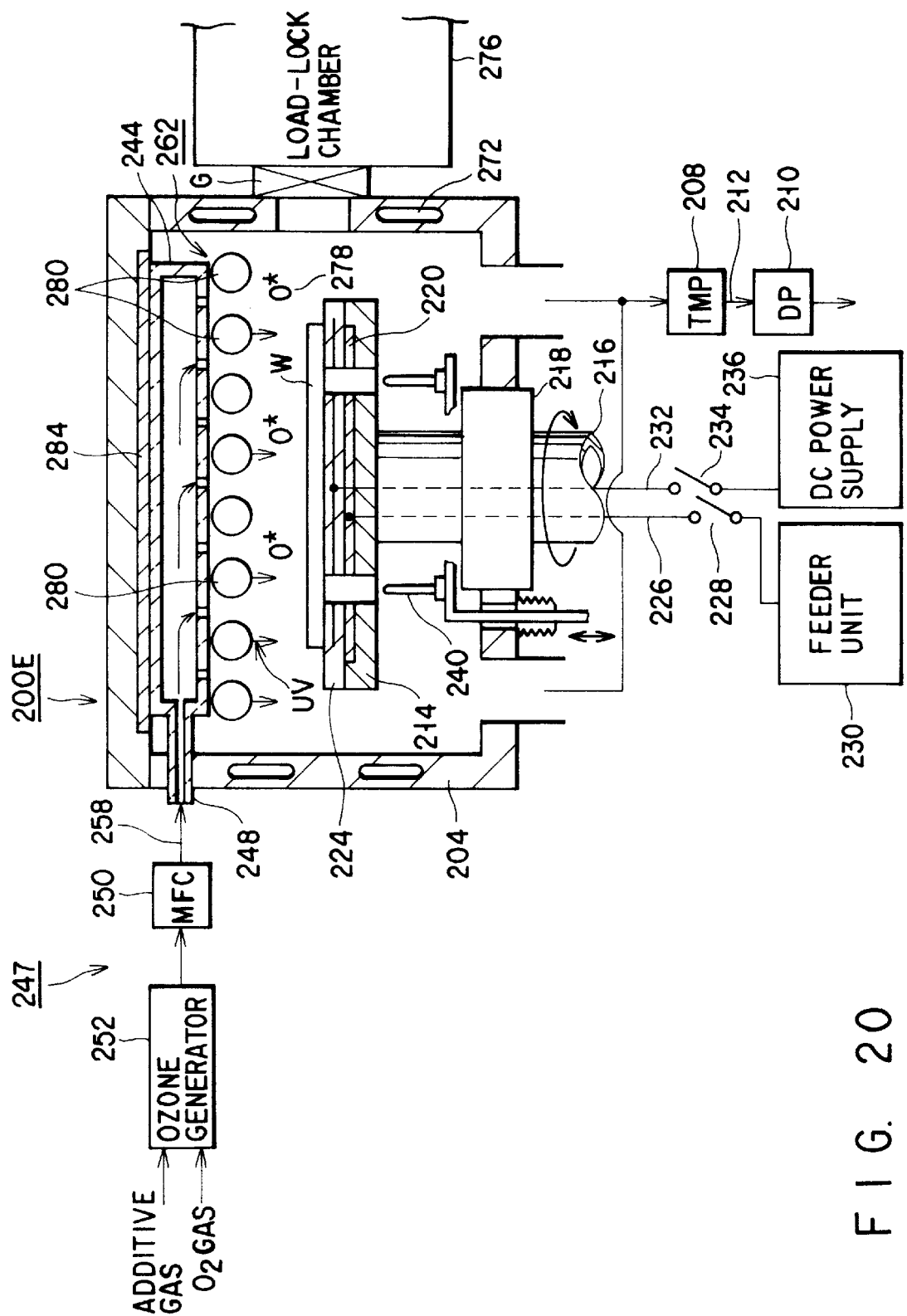
F I G. 20

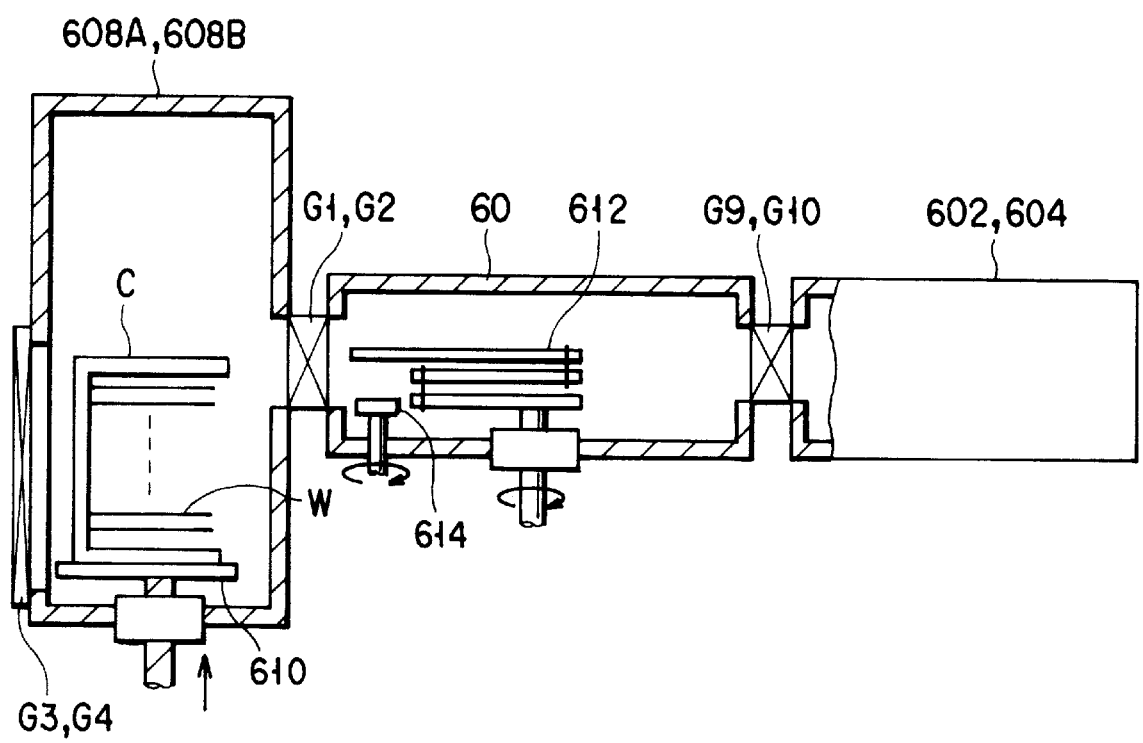
F I G. 31

FILM FORMING APPARATUS AND METHOD, AND FILM MODIFYING APPARATUS AND METHOD

BACKGROUND OF THE INVENTION

The present invention relates to an apparatus and method of forming a metal oxide film such as a tantalum oxide film suitable for an insulating film. The present invention also relates to an apparatus and method of modifying a metal oxide film.

Generally, to manufacture a semiconductor device, a semiconductor wafer is repeatedly subjected to a film formation process and a pattern etching process, thereby manufacturing a desired device. Particularly, specifications of a film forming technique are becoming stricter year by year as the density and integration of semiconductor devices become higher. For example, a very thin oxide film such as the insulating film of a capacitor or gate insulating film in a device is required to be thinner, and simultaneously, good insulating properties are required.

As the insulating film, a silicon oxide film or a silicon nitride film can be used. However, a metal oxide film such as a tantalum oxide ($Ta_2O_5$) film tends to be used recently as a material having better insulating characteristics. The metal oxide film exhibits highly reliable insulating properties although the film is thin. When the surface of the metal oxide film is modified after the film formation process, the insulating properties can be further improved. This technique is disclosed in Jpn. Pat. Appln. KOKAI Publication No. 2-283022 (to be referred to as related art 1 hereinafter.

Formation of a metal oxide film, e.g., a tantalum oxide film will be described below. The metallic alkoxide of tantalum ($Ta(OC_2H_5)_5$) is used as a film formation material, as disclosed in prior art 1. The metallic alkoxide of tantalum is bubbled with nitrogen gas or the like and supplied while keeping a semiconductor wafer at a process temperature of about 400° C. With this process, a tantalum oxide film ($Ta_2O_5$) is formed by CVD under a vacuum atmosphere.

To further improve the insulating properties as needed, the semiconductor wafer is loaded into an atmosphere containing ozone. A UV ray from a mercury lamp is irradiated to ozone under the atmospheric pressure to generate active oxygen atoms. The tantalum oxide film is modified using the active oxygen atoms, thereby obtaining an insulating film having more satisfactory characteristics.

In formation of an insulating film in a semiconductor device, it is important to improve the properties of the insulating film, as described above. Simultaneously, high productivity, i.e., a high throughput is required to mass-produce high-quality devices. The above-described film formation and modification processes take a long time, and the throughput is not so high.

In the film process, the growth rate of the tantalum oxide film is about 1 to 2 nm/min, and a great challenge is to largely increase the growth rate of the metal oxide film. In the modification process, about 30-minute modification process must be normally performed for one wafer to obtain a practical breakdown voltage, although the process time changes depending on the amount of UV rays or ozone. Accordingly, the throughput is insufficient to result in a high cost.

A technique of increasing the growth rate is disclosed in Jpn. Pat. Appln. KOKAI Publication No. 5-247650 (to be referred to as related art 2 hereinafter) in which an azeotropic organic solvent containing alcohols such as ethanol is added to the metallic alkoxide as a material for film formation, and the resultant mixture is vaporized and supplied into the film forming apparatus, thereby performing the film formation process.

BRIEF SUMMARY OF THE INVENTION

It is the first object of the present invention to provide a film forming apparatus and method capable of increasing the growth rate of a metal oxide film.

It is the second object of the present invention to provide a film modifying apparatus and method capable of increasing the breakdown voltage of a metal oxide film in a short time.

It is the third object of the present invention to provide a film forming/modifying apparatus capable of increasing the growth rate of a metal oxide film and simultaneously increasing the breakdown voltage of the metal oxide film.

There is provided a film forming apparatus for forming a metal oxide film on a surface of a target process object, comprising: a process vessel; a mounting table which is accommodated in the process vessel and on which the target process object is to be mounted; material supply means for supplying a vaporized metal oxide film material into the process vessel; alcohol supply means for supplying a vaporized alcohol into the process vessel; and a vacuum evacuation system for vacuum-evacuating the process vessel.

There is provided a film modifying apparatus for modifying a metal oxide film on a target process object, comprising: a process vessel; a mounting table which is accommodated in the process vessel and on which the target process object is mounted; process gas supply means for supplying a process gas containing at least one of oxygen, ozone, and $N_2O$ gas into the process vessel; active oxygen generation means for generating active oxygen atoms from the process gas in an atmosphere of the process vessel; and a vacuum evacuation system for vacuum-evacuating the process vessel.

There is provided a film forming /modifying apparatus comprising: a film formation process unit for forming a metal oxide film on a target process object in a vacuum atmosphere in which a vaporized metal oxide film material and a vaporized alcohol exist; a modification process unit for exposing the metal oxide film to active oxygen atoms in the vacuum atmosphere, thereby modifying the metal oxide film; and a common transfer chamber commonly coupled to the film formation process unit and the modification process unit to transfer the target process object between the film formation process unit and the modification process unit while keeping the vacuum state.

There is provided a method of forming a metal oxide film on a surface of a target process object in a process vessel set in a vacuum state, comprising the step of forming the metal oxide film in a vacuum atmosphere containing a metal oxide film material and an alcohol.

There is provided a method of modifying a metal oxide film formed on a surface of a target process object, comprising the steps of generating active oxygen atoms from a process gas containing at least one of oxygen, ozone, and $N_2O$ gas in a vacuum atmosphere, and modifying the metal oxide film on the surface of the target process object by the active oxygen atoms.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a graph showing the relationship between the modification process pressure and the breakdown voltage in UV irradiation in the ozone atmosphere in the film modifying apparatus shown in FIG. 9:

FIG. 12 is a graph showing the result of the modification process of a tantalum oxide film using a UV ray in a low-pressure atmosphere in the film modifying apparatus shown in FIG. 9;

FIG. 14 is a view showing the main part of a film modifying apparatus according to the third embodiment of the second aspect;

FIG. 15 is a bottom view showing the shower head of the film modifying apparatus shown in FIG. 14;

FIG. 16 is a graph showing the relationship between the aperture ratio of gas injection pipes and the breakdown voltage in the film modifying apparatus shown in FIG. 14;

FIG. 17 is a view showing the main part of a film modifying apparatus according to the fourth embodiment of the second aspect;

FIG. 20 is a view showing a film modifying apparatus according to the fifth embodiment of the second aspect;

FIG. 31 is a sectional view taken along the target process object conveyance route of the film forming/modifying system shown in FIG. 29.

DETAILED DESCRIPTION OF THE INVENTION

Figure 1:
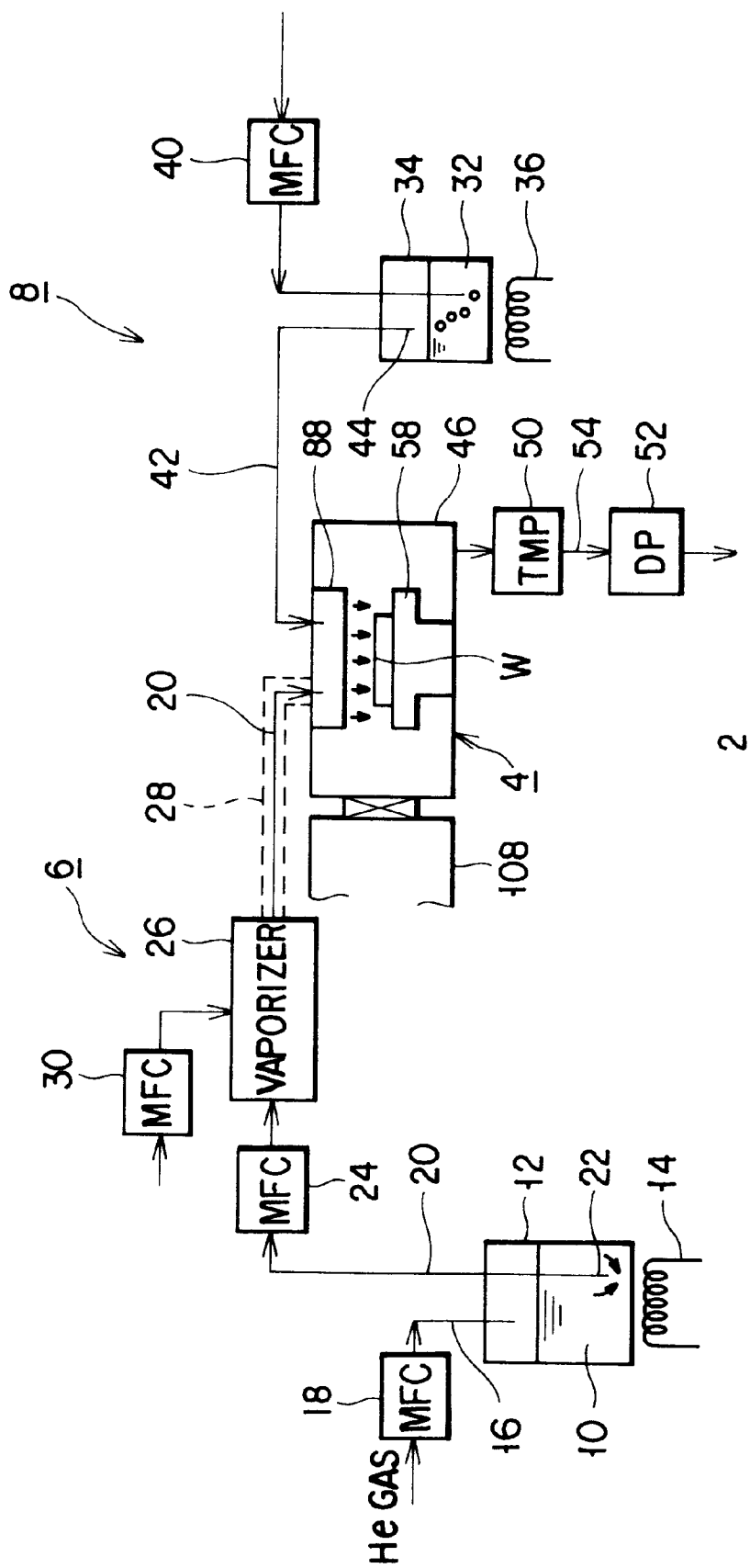
FIG. 1 is a schematic view showing the overall arrangement of a film forming apparatus according to the first embodiment of the first aspect.

The embodiments of the present invention will be described below with reference to the accompanying drawing.

A film forming apparatus and method according to the first aspect will be described first.

The present invention has made extensive studies on film formation conditions and found that the growth rate could be largely increased by adding an alcohol in a small quantity in the film formation process. With this finding, the present invention has completed the first aspect.

In the first aspect, a film forming apparatus for forming a metal oxide film on a target process object comprises a process vessel which can be vacuum-evacuated, a mounting table on which a target process object accommodated in the process vessel is mounted, a material supply means for supplying a vaporized metal oxide film material into the process vessel, an alcohol supply means for supplying a vaporized alcohol into the process vessel, and a vacuum evacuation system for vacuum-evacuating the process vessel.

In the film formation process, a vaporized metal oxide film material is supplied from the material supply means into the process vessel, and a vaporized alcohol is supplied from the alcohol supply means into the process vessel. The process vessel is evacuated by the vacuum evacuation system to a vacuum atmosphere at a predetermined pressure, and a metal oxide film is deposited on the surface of the target process object on the mounting table. At this time, film formation reaction is promoted directly by the alcohol, and simultaneously, indirectly by water generated by decomposition of the alcohol. As a result, the film formation reaction can be largely improved to increase the growth rate. The reason why the alcohol promotes the growth is that the water generated by decomposition of the alcohol promotes decomposition of the metal oxide film material and increases the growth rate of the oxide film.

The alcohol may be supplied by a supply means in a system independent of the metal oxide film material supply systems. For the supply means in an independent system, the alcohol content can be freely controlled even during the process. The process temperature is preferably set within the range of 250° C. to 450° C. The alcohol content is preferably set within the range of 0.1 wt. % to 20 wt. %.

As the metal oxide film material, a metallic alkoxide can be used. The metal oxide film formed by the film forming apparatus according to the first aspect contains one of tantalum oxide, titanium oxide, zirconium oxide, barium oxide, and strontium oxide.

The present invention has further examined the film formation promotion function of the alcohol and found that the formed film itself exhibited a function as an alcohol decomposition catalyst for decomposing the alcohol and promoted generation of water.

When the alcohol decomposition catalyst is placed in the process vessel, e.g., above the mounting table, decomposition of the alcohol is promoted so that film formation can be further promoted. As the alcohol decomposition catalyst, a metal oxide film can be mainly used.

According to the film forming apparatus and method of the first aspect, excellent functions/effects to be described below can be obtained.

In formation of the metal oxide film, the alcohol supply means is arranged to add the alcohol to the metal oxide film material. With this arrangement, the growth rate of the metal oxide film can be largely increased, and accordingly, the throughput can be improved.

A film forming apparatus according to the first embodiment of the first aspect of will be described below with reference to the accompanying drawing.

Figure 2:
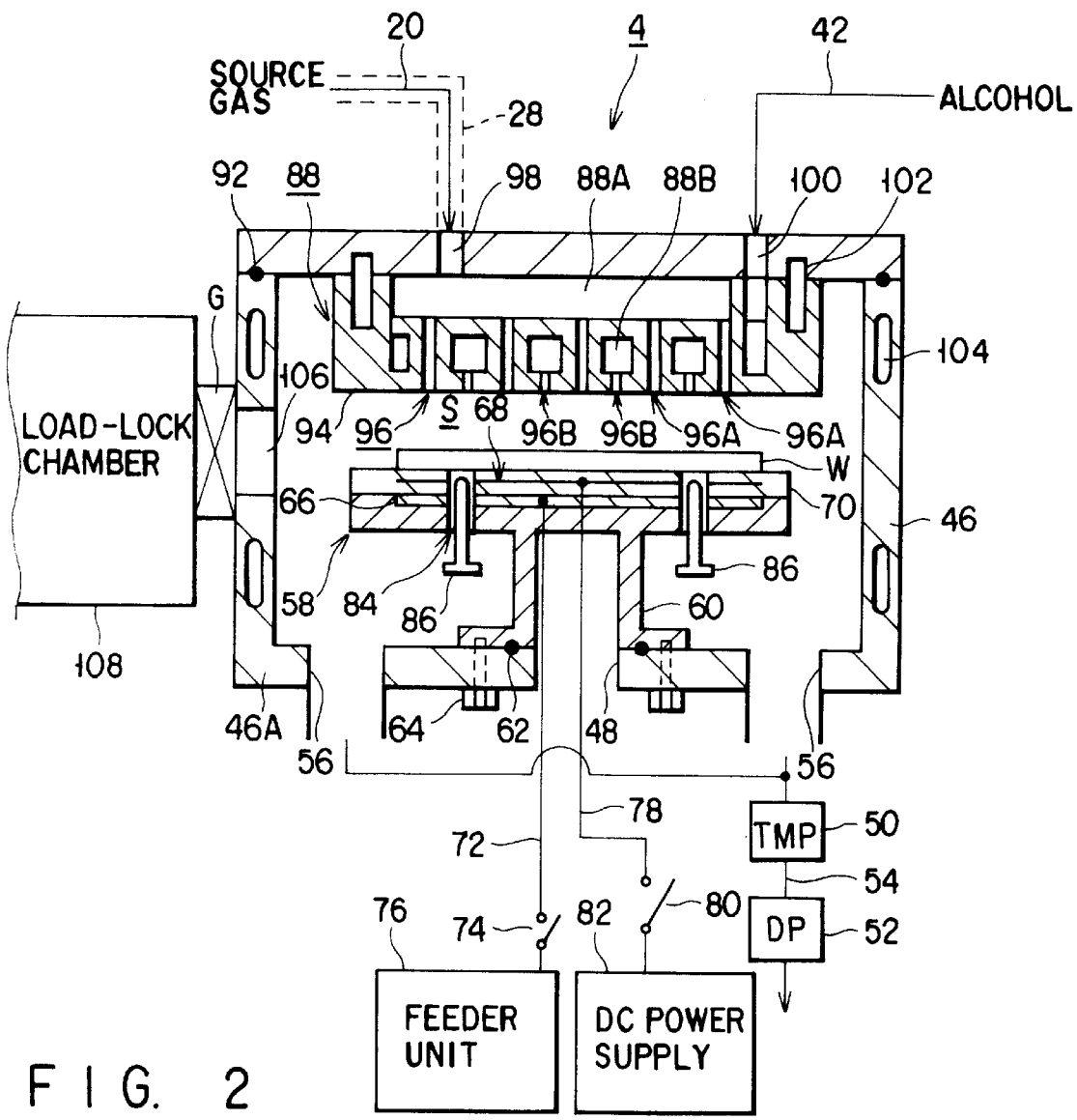
FIG. 2 is a view showing the main body of the film forming apparatus shown in FIG. 1.

FIG. 1 is schematic view showing the overall arrangement of the film forming apparatus according to the first embodiment of the first aspect. FIG. 2 a view showing the main body of the film forming apparatus shown in FIG. 1. As a metal oxide film, a tantalum oxide film ($Ta_2O_5$) is formed by CVD.

A film forming apparatus 2 is mainly constituted by an apparatus main body 4, a material supply means 6 for supplying a vaporized metal oxide film material as a source gas to the apparatus main body 4, and an alcohol supply means 8.

The material supply means 6 has a closed material tank 12 which stores a liquid metal oxide film material 10, e.g., a metallic alkoxide such as $Ta(OC_2H_5)_5$ as a material. The tank 12 is heated by a heater 14 to a temperature of, e.g., 20° C. to 50° C. at which the material 10 readily flows.

The distal end of a pressure pipe 16 is inserted into a vapor phase portion in the material tank 12 from the upper side. A flow controller 18 such as a mass flow controller (MFC) is arranged midway along the pressure pipe 16. A pressurized gas, e.g., He gas is supplied to the vapor phase portion in the material tank 12 through the pressure pipe 16.

A material supply passage 20 consisting of, e.g., a stainless steel pipe is arranged such that the material tank 12 communicates with the ceiling portion of the apparatus main body 4. A material introduction port 22 of the material supply passage 20, which is dipped in the liquid material in the tank 12, is located near the bottom portion of the tank 12. When the He gas is supplied to the vapor phase portion in the material tank 12 through the pressure pipe 16, the liquid material is pressurized and supplied into the material supply passage 20.

A liquid flow controller 24 and a vaporizer 26 are arranged in the middle of the material supply passage 20 toward the apparatus main body 4. The vaporizer 26 vaporizes the material into a source gas. The source gas is supplied to the apparatus main body 4 through the material supply passage 20.

Since the liquid flow rate is normally as low as about 5 mg/min, a pipe having an inner diameter of about 1 to 2 mm is used for the material supply passage 20 at a portion from the material tank 12 to the vaporizer 26. On the other hand, a pipe having a large inner diameter of, e.g., about 10 to 20 mm is used for the passage 20 on the downstream side of the vaporizer 26 because a gasified material flows through this portion. A heater 28 for heat insulation, which is constituted by, e.g., a tape heater, is wound on the material supply passage 20 on the downstream side of the vaporizer 26 so that the source gas is kept at a temperature higher than the liquefying temperature of the source gas and lower than the decomposition temperature of the source gas, e.g., within the range of 150° C. to 180° C.

A vaporizing gas, e.g., He gas is flow-controlled by a flow controller 30 and supplied to the vaporizer 26.

The alcohol supply means 8 has a closed alcohol tank 34 which stores an alcohol as a liquid additive 32. The tank 34 has a heater 36. The heater 36 heats the alcohol 32 to promote vaporization of the alcohol.

A bubbling pipe 38 is inserted into the alcohol tank 34. The distal end of the bubbling pipe 38 is dipped in the alcohol 32 and located near the bottom portion of the tank 34. A flow controller 40 is inserted to the bubbling pipe 38. With this arrangement, a bubbling gas such as $O_2$ gas or $N_2$ gas is flow-controlled and supplied to bubble and vaporize the liquid alcohol 32 by bubbling.

An alcohol supply passage 42 consisting of, e.g., a stainless steel pipe is arranged such that the alcohol tank 34 communicates with the ceiling portion of the apparatus main body 4. An introduction port 44 of the alcohol supply passage 42 is inserted into the vapor phase portion in the alcohol tank 34 such that the vaporized alcohol generated by bubbling can be supplied to the apparatus main body 4.

The type of alcohol used as an additive is not particularly limited. For example, in addition to a lower alcohol such as methyl alcohol or ethyl alcohol, a higher alcohol having a carbon number of 6 or more can be used. The pressurized gas supplied to the alcohol tank 34 is not limited to $O_2$ gas or $N_2$ gas, and an inert gas such as He gas or Ar gas may be used. The temperature of the alcohol tank 34 changes depending on the type of alcohol. For methyl alcohol, the temperature is preferably set within the range of 20° C. to 30° C.

The apparatus main body 4 has a cylindrical process vessel 46 consisting of, e.g., aluminum, as shown in FIG. 2. A feeder line insertion hole 48 is formed at the central portion of a bottom portion 46A of the process vessel 46. Exhaust ports 56 are formed at the peripheral portion of the bottom portion 46A. The exhaust ports 56 are connected to a vacuum evacuation system 54. Vacuum evacuation pumps, e.g., a turbo molecular pump (TMP) 50 and a dry pump (DP) 52 are inserted into the vacuum evacuation system 54. With this arrangement, the process vessel 46 can be vacuum-evacuated. A plurality of, e.g., four exhaust ports 56 are formed in the bottom portion 46A of the vessel at an equal angular interval on the same circumference. Each exhaust port 56 commonly communicates with the turbo molecular pump 50 and the dry pump 52 through the vacuum evacuation system 54.

A mounting table 58 consisting of a nonconductive material, e.g., alumina is arranged in the process vessel 46. A hollow cylindrical leg portion 60 is integrally formed at the central portion of the lower surface of the mounting table 58. The lower end of the leg portion 60 is hermetically attached and fixed to the peripheral portion of the feeder line insertion hole 48 of the vessel bottom portion 46A through a sealing member 62 such as an O-ring. Therefore, the leg portion 60 is extremely opened and set in a hermetic state with respect to the process vessel 46.

A heating resistor 66 consisting of carbon coated with, e.g., silicon carbide (SiC) is buried in the mounting table 58 so that a semiconductor wafer W as a target process object mounted on the upper surface of the mounting table 58 can be heated to a desired temperature. The upper portion of the mounting table 58 is constituted as a thin electrostatic chuck 70 formed of a ceramic in which a chuck electrode 68 consisting of a conductive plate of, e.g., copper is buried. The wafer W is chucked and held on the upper surface of the mounting table 58 by a Coulomb's power generated by the electrostatic chuck 70. A backside gas such as He gas may be flowed to the surface of the electrostatic chuck 70 to improve the thermal conductivity to the wafer or prevent film formation on the lower surface of the wafer W. Instead of the electrostatic chuck 70, a mechanical clamp may be used.

An insulated lead line 72 for feeding is connected to the heating resistor 66. The lead line 72 is externally extracted through the cylindrical leg portion 60 and the feeder line insertion hole 48 without being exposed to the atmosphere in the process vessel 46, and connected to a feed unit 76 through an opening/closing switch 74. An insulated lead line 78 for feeding is connected to the chuck electrode 68 of the electrostatic chuck 70. The lead line 78 is also externally extracted through the cylindrical leg portion 60 and the feeder line insertion hole 48 without being exposed to the atmosphere in the process vessel 46, and connected to a high-voltage DC power supply 82 through an opening/closing switch 80. As a means for heating the wafer, a heating lamp such as a halogen lamp may be used in place of the heating resistor 66.

A plurality of lifting holes 84 extend through the mounting table 58 at predetermined positions of the peripheral portion. Wafer lifting pins 86 capable of moving upward/downward are accommodated in the lifting holes 84. When the wafer lifting pins 86 are moved upward/downward by an elevating mechanism (not shown) in loading/unloading of the wafer W, the wafer W is moved upward/downward. Generally, three wafer lifting pins 86 are arranged in correspondence with the peripheral portion of the wafer.

A ceiling plate 90 integrated with a shower head 88 is hermetically attached to the ceiling portion of the process vessel 46 through a sealing member 92 such as an O-ring. The shower head 88 opposes the mounting table 58 to substantially cover the entire upper surface of the mounting table 58 so that a process space S is formed between the shower head 88 and the mounting table 58. The shower head 88 showers a source gas for film formation into the process vessel 46. A number of injection ports 96 for injecting the gas are formed in a lower injection face 94 of the shower head 88.

Figure 3:
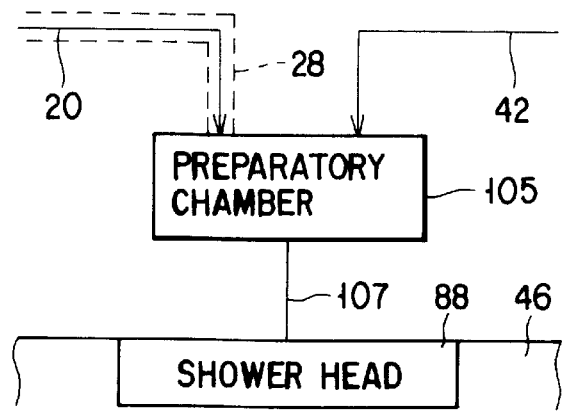
FIG. 3 is a schematic view showing a modification of a material supply means and an alcohol supply means of the film forming apparatus shown in FIG. 1.

The interior of the shower head 88 is partitioned into a source gas head space 88A and an alcohol head space 88B. A gas introduction port 98 communicating with the source gas head space 88A is connected to the material supply passage 20 extending from the vaporizer 26 so that the vaporized metal oxide film material is supplied to the source gas head space 88A. A gas introduction port 100 communicating with the alcohol head space 88B is connected to the alcohol supply passage 42 so that the vaporized alcohol is supplied to the alcohol head space 88B. The injection ports 96 are divided into two groups, i.e., source gas injection holes 96A communicating with the source gas head space 88A and alcohol injection holes 96B communicating with the alcohol head space 88B. The source gas and alcohol injected from the injection holes 96A and 96B are mixed in the process space S and supplied in a so-called post-mix state. The gas supply system is not limited to the post-mix system. The two gases may be mixed in the shower head 88 in advance. Alternatively, a preparatory chamber 105 may be arranged before the process vessel 46, as shown in FIG. 3, and the material supply passage 20 and the alcohol supply passage 42 may be connected to the preparatory chamber 105. The source gas and the alcohol may be mixed in the preparatory chamber 105 to obtain a gas mixture, and this gas mixture may be supplied to the process vessel 46 through a gas mixture supply passage 107.

A cooling jacket 102 is arranged in the side wall of the shower head 88 to cool the side wall to, e.g., about 140° C. to 170° C., thus preventing decomposition of the source gas at this portion. A refrigerant such as warm water at about 50° C. to 70° C. is flowed in the cooling jacket 102. The distance between the shower head 88 and the mounting table 58 is set to about 10 to 30 mm.

A cooling jacket 104 is arranged in the side wall of the process vessel 46 to cool the side surface. A refrigerant such as hot water at about 50° C. to 70° C. is flowed in the cooling jacket 104, thereby maintaining the side surface within the range of 140° C. to 170° C. at which neither liquefaction nor thermal decomposition of the source gas occur. A wafer loading/unloading port 106 is formed at part of the side wall of the process vessel 46. A gate valve G for connecting/shielding the process vessel 46 to/from a load-lock chamber 108 which can be vacuum-evacuated is provided at the wafer loading/unloading port 106. Although not illustrated, a means for supplying $N_2$ gas for purging is arranged, as a matter of course.

A film forming method according to the first aspect will be described next on the basis of the film forming apparatus 2 having the above arrangement.

The semiconductor wafer W which has not been processed yet is loaded to the process vessel 46 kept in the vacuum state through the wafer loading/unloading port 106 form the side of the load-lock chamber 108. The wafer W is mounted on the mounting table 58 and chucked and held by the Coulomb's power of the electrostatic chuck 70.

The wafer W is maintained at a predetermined process temperature by the heating resistor 66. While the process vessel 46 is vacuum-evacuated and kept at a predetermined process pressure, the source gas and the alcohol are supplied to start the film formation process.

The material supply means 6 supplies a flow-controlled and pressurized gas such as He gas into the material tank 12. The metal oxide film material 10 consisting of liquid $Ta(OC_2H_5)_5$ is transferred in the material supply passage 20 under the pressure of the pressurized gas while being flow-controlled by the liquid flow controller 24. The flow rate of the pressurized gas at the time is, e.g., several hundred SCCM. The flow rate of the liquid material is as low as several mg/min, although this flow rate changes depending on the growth rate. The material 10 in the material tank 12 is heated by the heater 14 to lower the viscosity. For this reason, the material 10 can be relatively smoothly transferred in the material supply passage 20 under pressure. The liquid material which has been transferred under pressure is vaporized by the vaporizer 26 using a vaporizing gas such as He gas which is flow-controlled to, e.g., 200 to 500 SCCM. The gasified material further flows through the material supply passage 20 downstream and is supplied into the shower head 88 of the process vessel 46. The material supply passage 20 on the downstream side is heated to a predetermined temperature of, e.g., 130° C. by the heater 28. For this reason, the source gas can be stably flowed to the shower head 88 without being reliquefied or thermally decomposed. The source gas reaching the shower head 88 is temporarily flowed into the source gas head space 88A and then supplied to the process space S through the source gas injection holes 96A formed in the injection face 94.

In the alcohol supply means 8, a flow-controlled bubbling gas such as $N_2$ gas or $O_2$ gas is supplied to the alcohol tank 34 which stores the alcohol 32 as an additive. The alcohol is vaporized with the bubbling gas and flows in the alcohol supply passage 42. The alcohol 32 in the alcohol tank 34 is heated by the heater 36 and therefore can be easily vaporized. The flow rate of the bubbling gas is, e.g., 1 to 2 L/min, although it changes depending on the growth rate. The alcohol content is set within the range of about 0.1 wt. % to 20 wt. % with respect to the metallic alkoxide as a material.

The gasified alcohol flowing through the alcohol supply passage 42 reaches the alcohol head space 88B of the shower head 88 and is supplied to the process space S through the alcohol injection holes 96B formed in the injection face 94. In this case, the alcohol content can be precisely controlled by the flow controller 40 for flow-controlling the bubbling gas.

The source gas and gasified alcohol injected to the process space S are mixed in the process space S and react with each other, thus depositing, e.g., a tantalum oxide film ($Ta_2O_5$) on the wafer surface.

The added alcohol directly promotes the film formation reaction, and water indirectly generated by decomposition of the alcohol also promotes the film formation reaction. As a result, the film formation reaction is largely improved to increase the growth rate.

Figure 4:
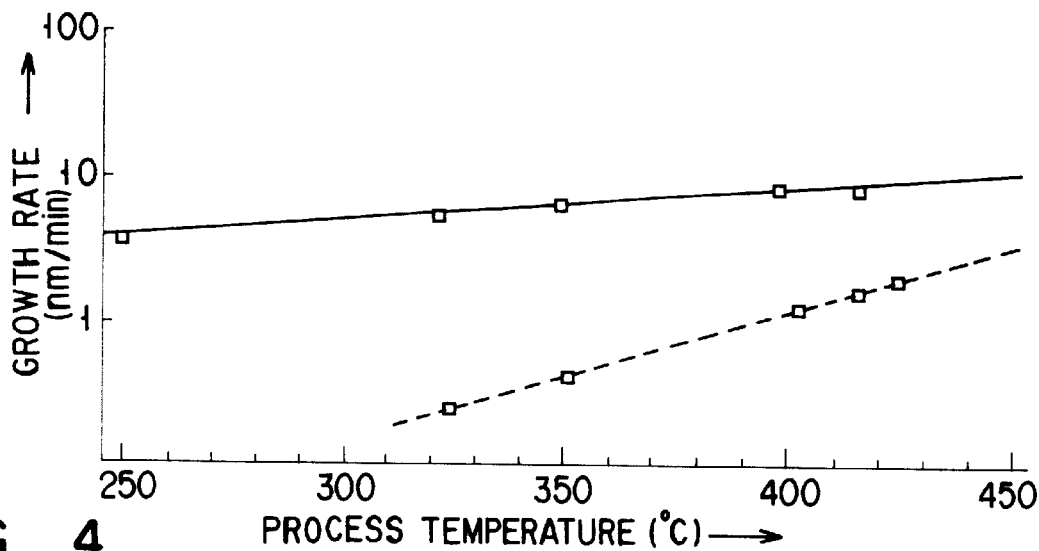
FIG. 4 is a graph showing the relationship between the process temperature and the growth rate in the film forming apparatus shown in FIG. 1.

FIG. 4 is a graph showing the relationship between the process temperature and the growth rate in the film forming apparatus 2 according to the first embodiment of the first aspect. The solid line represents the method of the first aspect in which the alcohol is added. The broken line represents the conventional method in which no alcohol is added. The process conditions are as follows. The alcohol content with respect to the metallic alkoxide is 2 wt. %, and ethanol is used as an alcohol. The process pressure is set to be 0.2 to 0.3 Torr. As is apparent from FIG. 4, in the conventional method represented by the broken line, the growth rate is about 1 nm/min. However, when the alcohol is added, as in the first aspect, a high growth rate of about 10 nm/min is observed independently of the process temperature, so that a growth rate 10-times higher can be achieved. The process temperature of the substrate is set within the range of 250° C. to 450° C. When the process temperature is lower than 250° C., the growth rate largely lowers, so no sufficient productivity can be obtained. Inversely, when the process temperature is higher than 450° C., the growth rate becomes too high, and the uniformity of the film thickness largely degrades. Additionally, thermal diffusion at the interface between the substrate and the oxide film degrades the film quality. Furthermore, since a similar growth rate can be obtained even without adding any alcohol, addition of the alcohol loses the advantage.

Figure 5:
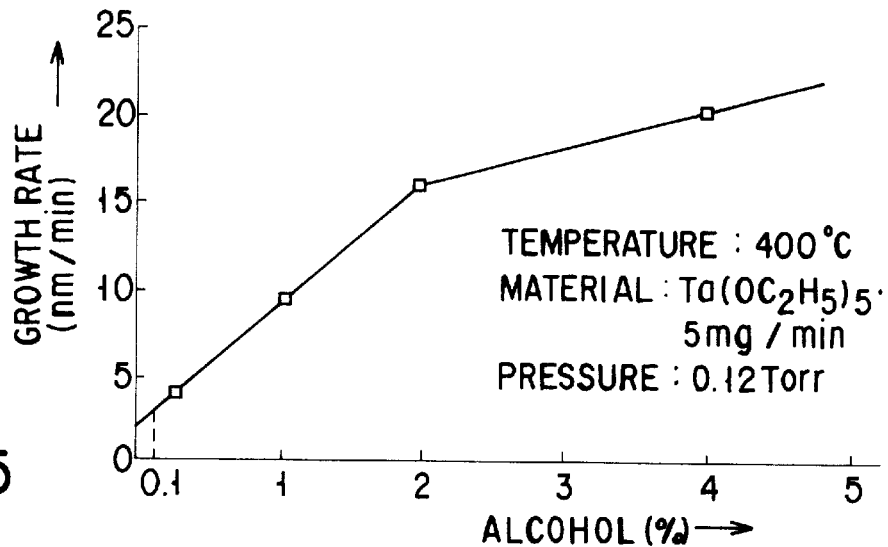
FIG. 5 is a graph showing the relationship between the alcohol content in a metallic alkoxide and the growth rate in the film forming apparatus shown in FIG. 1.

FIG. 5 is a graph showing the relationship between the alcohol content with respect to the metallic alkoxide and the growth rate in the first embodiment of the first aspect. The process conditions are a follows. The process temperature of the substrate is 400° C. The flow rate of the source gas, i.e., $Ta(OC_2H_5)_5$ is 5 mg/min. The total supply amount of the source gas and the alcohol is 2,000 cc. The process pressure is 0.12 Torr. The growth time is 60 sec. The type of alcohol is ethanol.

Figure 6:
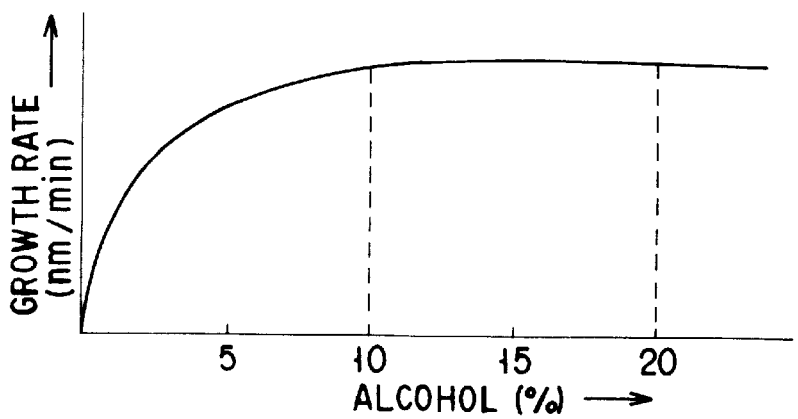
FIG. 6 is a graph showing the growth rate obtained when the alcohol content is increased to 20 wt. % or more in the film forming apparatus shown in FIG. 1.

As is apparent from FIG. 5, as the alcohol content increases, the growth rate becomes higher. To obtain a generally required growth rate of 3 nm/min or more, 0.1 wt. % or more of the alcohol must be added. When the alcohol content extends 4.0 wt. %, the growth rate becomes high and is gradually saturated, as shown in FIG. 6. FIG. 6 is a graph showing the growth rate observed when the alcohol content is increased to 20 wt. % or more. As is apparent from FIG. 6, the growth rate is substantially saturated when the alcohol content is about 10 wt. %. The film quality was checked, revealing that when the alcohol content exceeded 20 wt. %, the uniformity of film thickness or film quality abruptly degraded. Therefore, the alcohol content is preferably set within the range of 0.1 wt. % to 20 wt. %.

An inert gas such as $N_2$ gas or He gas may be used as a bubbling gas. However, when $O_2$ gas is used, the film formation process can be performed under a high partial pressure of $O_2$, so that the growth rate and the uniformity of the film thickness can be further improved.

The alcohol supply means 8 and the material supply means 6 are independently arranged. With this arrangement, even when the alcohol is evaporated in the alcohol tank 34 or the like, the concentration of the alcohol itself does not vary. For this reason, the mixing ratio of the alcohol and the material can always be precisely controlled to be constant, and the growth rate does not vary.

The reason why the growth rate can be increased by adding the alcohol is that the formed $Ta_2O_5$ film itself functions as a catalyst for the alcohol and promotes decomposition of the alcohol, thereby helping generation of water.

In this embodiment, the tantalum oxide film is formed as a metal oxide film. However, the metal oxide film is not limited to this. The film forming apparatus and method according to the first aspect can be applied to formation of another metal oxide film such as a titanium oxide film, a zirconium oxide film, a barium oxide film, or a strontium oxide film. As a material, the metallic alkoxide of the corresponding metal is used. The first aspect can be applied to formation of a niobium oxide film, a hafnium oxide film, an yttrium oxide film, or a lead oxide film, in addition to the above-described metal oxide films. Each of these metal oxide films functions as an alcohol decomposition catalyst by itself, so that the growth rate can be increased.

As described above, the formed film itself can promote decomposition of the alcohol to increase the growth rate. For this reason, when a film is to be formed using a metallic alkoxide as a material, an alcohol decomposition catalyst can be independently set in the process vessel to further increase the growth rate.

Figure 7:
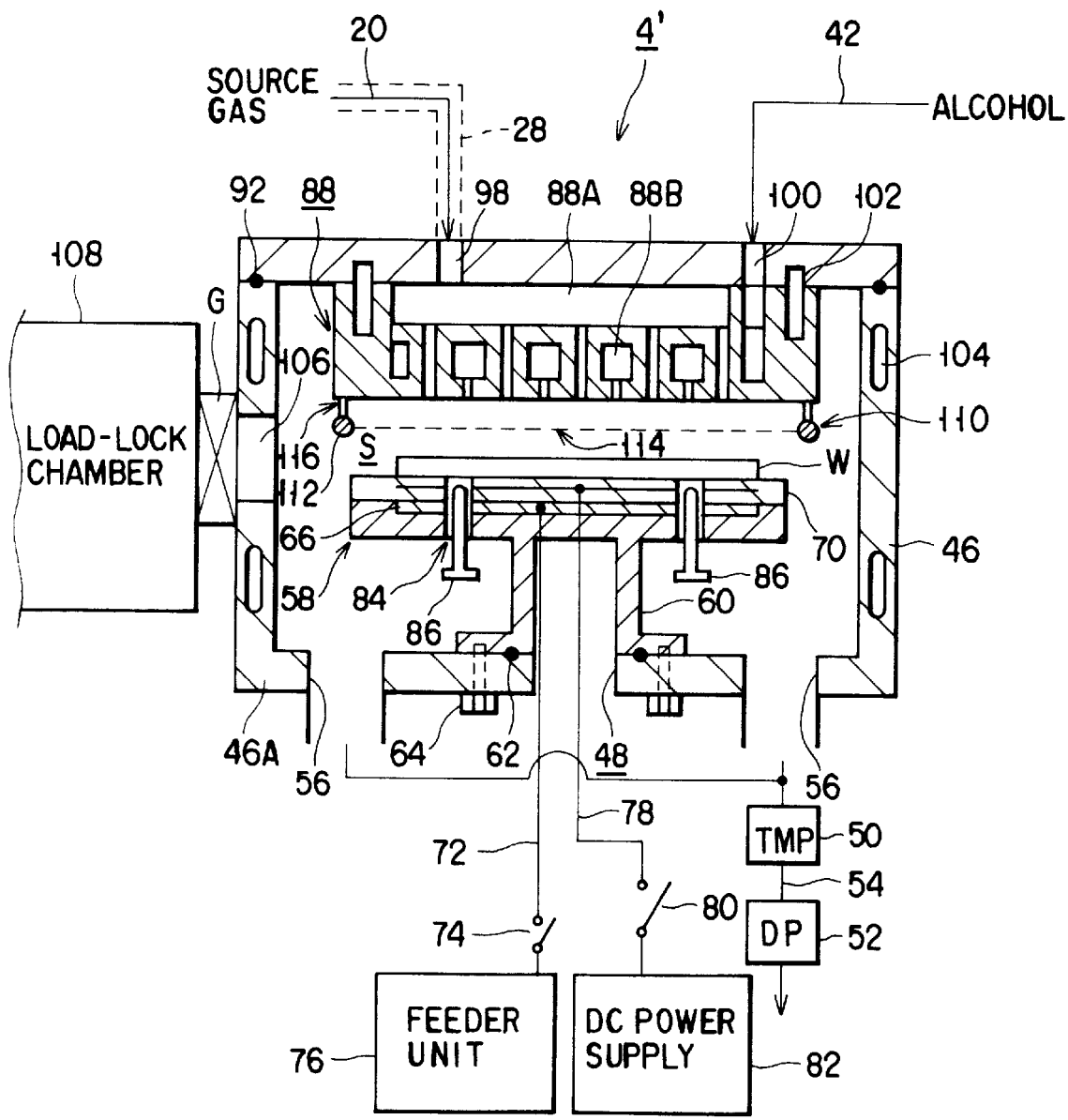
FIG. 7 is a view showing the main body of a film forming apparatus according to the second embodiment of the first aspect.
Figure 8:
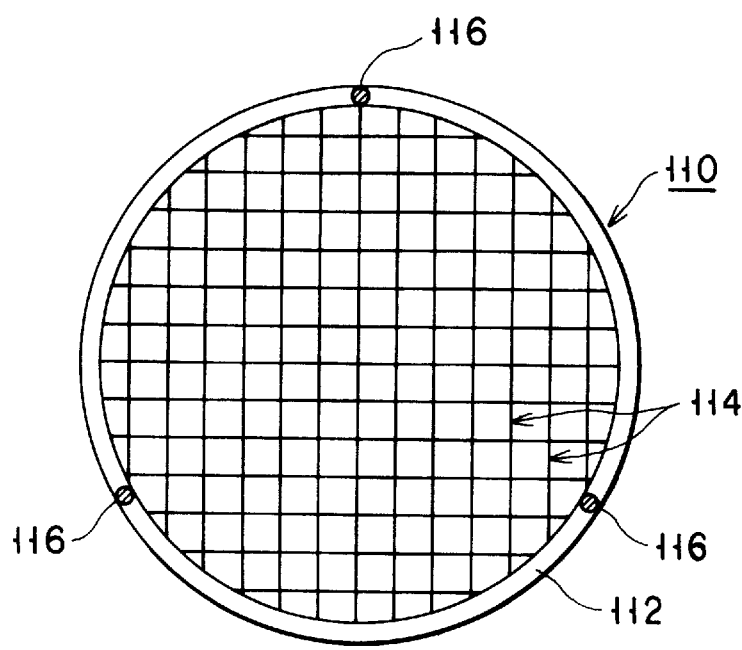
FIG. 8 is a plan view showing the shape of an alcohol decomposition catalyst used in the film forming apparatus shown in FIG. 7.

FIG. 7 is a view showing the main body of such a film forming apparatus. FIG. 8 is a plan view showing the shape of an alcohol decomposition catalyst used in the film forming apparatus shown in FIG. 7. The same reference numerals as in the film forming apparatus 2 shown in FIG. 1 and the apparatus main body 4 shown in FIG. 2 denote the same parts in FIG. 7, and a detailed description thereof will be omitted.

As shown in FIG. 7, in a film forming apparatus 4', an alcohol decomposition catalyst 110 is arranged between the lower surface of a shower head 88 and a mounting table 58 to positively promote decomposition of an alcohol, thereby helping generation of water.

More specifically, for the alcohol decomposition catalyst 110, cotton members 114 are extended in a ring-shaped support ring 112 larger than the diameter of a wafer W to form a matrix or net structure, as shown in FIG. 8. The support ring 112 is fixed under the shower head 88 through support rods 116 not to impede injection of a source gas or alcohol.

With this arrangement, when the alcohol passes among the cotton members 114 of the alcohol decomposition catalyst 110, the alcohol contacts the catalyst, and decomposition of the alcohol is promoted to generate much water. Accordingly, the growth rate increases.

As the alcohol decomposition catalyst 110, a metal oxide such as titanium oxide, zirconium oxide, strontium oxide, niobium oxide, hafnium oxide, yttrium oxide, or lead oxide can be used in addition to tantalum oxide. A metal oxide such as $W_2O_5$, $Mo_2O_5$, $Fe_2O_3$, $ThO_3$, $Al_2O_3$, $V_2O_5$, $CdO$, $VO_2$, $Cr_2O_3$, $MnO$, $BeO$, $SiO_2$, or $MgO$ can also be used as the catalyst. Alternatively, a composite oxide such as $SiO$—$Al_2O_3$, platinum, or a nitride such as $TiN$, $AlN$, or $TaN$ can also be used as the catalyst.

In this embodiment, the alcohol decomposition catalyst is set between the mounting table 58 and the shower head 88. However, the arrangement is not limited to this. For example, the alcohol decomposition catalyst may be applied to the inner surface of the shower head 88, which contacts the alcohol so that a coat of the catalyst is formed on the inner surface. Alternatively, a ring-shaped alcohol decomposition catalyst may be set at the outer peripheral portion of the mounting table 58.

In the embodiments of the first aspect, a film is formed on a semiconductor wafer as a target process object. However, the target process object is not limited to this, and the embodiments can also be supplied to film formation on, e.g., a glass substrate or LCD substrate.

A film modifying apparatus and method according to the second aspect will be described below.

The present invention has made extensive studies on film modification conditions and found that modification could be performed in a short time by performing the modification process not in the air but in the vacuum. With this finding, the present invention has completed the second aspect.

In order to solve the above problem, according to the second aspect, there is provided a metal oxide film modifying apparatus for modifying a metal oxide film formed on the surface of a target process object, comprising a process vessel which can be vacuum-evacuated, a mounting table on which the target process object accommodated in the process vessel is mounted, a process gas supply means for supplying a process gas containing oxygen atoms, ozone or $N_2O$ gas into the process vessel, an active oxygen generation means for generating active oxygen atoms in the atmosphere of the process vessel, and a vacuum evacuation system for vacuum-evacuating the process vessel.

As the active oxygen generation means, a UV irradiation means for irradiating a UV ray on ozone or $N_2O$ gas to generate active oxygen atoms, a plasma generation means for applying a microwave or a high-frequency field to oxygen atoms, ozone or $N_2O$ gas to generate a plasma, thereby generating active oxygen atoms from the process gas, or a heating means for heating the target process object in the ozone or $N_2O$ gas atmosphere to generate active oxygen atoms an be used.

A case wherein the UV irradiation means is used as the active oxygen generation means will be described below. A metal oxide film such as a tantalum oxide film is formed on the surface of the target process object in the previous process. This target process object is mounted and held on the mounting table in the process vessel and subjected to the modification process. The interior of the process vessel is maintained under a predetermined vacuum pressure by the vacuum evacuation system. When a UV ray emitted from the UV irradiation means is irradiated on ozone or $N_2O$ gas supplied from the process gas supply means, active oxygen atoms are generated. In this case, since the process vessel is set in the vacuum state, the time until the generated active oxygen atoms vanish is prolonged to increase the concentration. As a result, the modification process can be quickly performed.

In this case, the pressure during the modification process is preferably set within the range of 1 to 600 Torr. Outside this range, no sufficient modification process can be performed, and the breakdown voltage of the metal oxide film lowers. The temperature of the target process object in the modification process is preferably set within the range of 320° C. to 700° C. An effect is obtained at 300° C. to 350° C. under the atmospheric pressure, at 350° C. to 450° C. at a pressure from 10 Torr to the atmospheric pressure, or at 400° C. to 700° C. at 10 Torr or less.

However, a satisfactory modification effect can be obtained at 700° C. by increasing the degree of vacuum. Since the wall of the process vessel is water-cooled, and decomposition of ozone mainly takes place on the substrate surface, the modification effect does not decrease due to decomposition of ozone.

Various structures can be used for the UV irradiation means. For example, a microwave generated from a microwave generation means may be applied to a mercury-sealed lamp in which mercury is sealed to generate a UV ray, and the UV ray may be condensed by a reflecting mirror and irradiated on the process gas, thereby generating active oxygen atoms. Alternatively, a plurality of cylindrical UV lamps may be arrayed in parallel.

When a plasma is used instead of a UV ray to generate active oxygen atoms, a microwave or a high-frequency field is applied to a process gas containing at least one of $O_2$ gas, ozone, and $N_2O$ gas, thereby generating active oxygen atoms.

Alternatively, a structure in which a plurality of gas injection pipes each having a number of injection holes are combined in a lattice shape may be used as the shower head of the process gas supply means. In this case, since the gas injection pipes are arrayed in a matrix shape, most UV rays are directly irradiated on the target process object side without passing through the shower head consisting of silica glass. Therefore, not so many UV rays are absorbed in the ozone in the shower head, and the modification efficiency can be increased.

In this case, the projection area of the gas injection pipes with respect to the upper surface of the mounting table is preferably set to be smaller than 20% of the surface area of the target process object.

Alternatively, a container-shaped lid with its lower open end portion is arranged as part of the process gas supply means to cover the target process object. An introduction header portion having injection holes is formed on one side of this lid, and a delivery header portion having a delivery port is formed on the other side. In the modification process, a gas flow is formed in the horizontal direction in the lid while the target process object is covered from the upper side.

With this structure, active oxygen atoms can be generated near the surface of the target process object at a high concentration, so that the modification efficiency can be largely increased.

To enable loading and unloading of the target process object, the lid and the mounting table are designed to be made close or separated relative to each other in the vertical direction.

As another example, a metal oxide film modifying apparatus for modifying a metal oxide film formed on the surface of a target process object comprises a process vessel which can be vacuum-evacuated, a mounting table on which the target process object accommodated in the process vessel is mounted, a process gas supply means for supplying a process gas containing ozone or $N_2$ gas into the process vessel, a heating means for heating the target process object, and a vacuum evacuation system for vacuum-evacuating the process vessel. The heating means heats the target process object within the range of 400° C. to 850° C.

According to this arrangement, without irradiating UV rays, the target process object is maintained at a predetermined temperature while supplying ozone or $N_2O$ gas, thereby decomposing the ozone or $N_2O$ gas on the surface of the target process object to generate active oxygen atoms. With this process, the film can be modified.

In this case, the modification process temperature is preferably set within the range of 400° C. to 850° C. and, more preferably, within the range of 450° C. to 500° C. As the heating means, a heating lamp is preferably used to heat the target process object from the lower side of the mounting table. To suppress decomposition of ozone near the side wall of the process vessel due to vapor phase reaction, a cooling jacket is preferably arranged in the side wall of the process vessel to cool the side wall to a temperature lower than the thermal decomposition temperature of ozone.

As the metal oxide film as a modification target in the second aspect, a tantalum oxide film, a titanium oxide film, a zirconium oxide film, a barium oxide film, or a strontium oxide film can be used.

The film modifying apparatus and method according to the second aspect can exhibit excellent functions/effects to be described below.

When the metal oxide film formed on the target process object is to be modified, active oxygen atoms are caused to act on the target process object in the vacuum atmosphere. With this arrangement, the life of the active oxygen atoms can be prolonged, and the density of the active oxygen atoms can be increased. The metal oxide film can be modified into an insulating film having a high breakdown voltage in a short time, thereby improving the throughput.

A film modifying apparatus and method according to an embodiment of the second aspect will be described below in detail with reference to the accompanying drawing.

Figure 9:
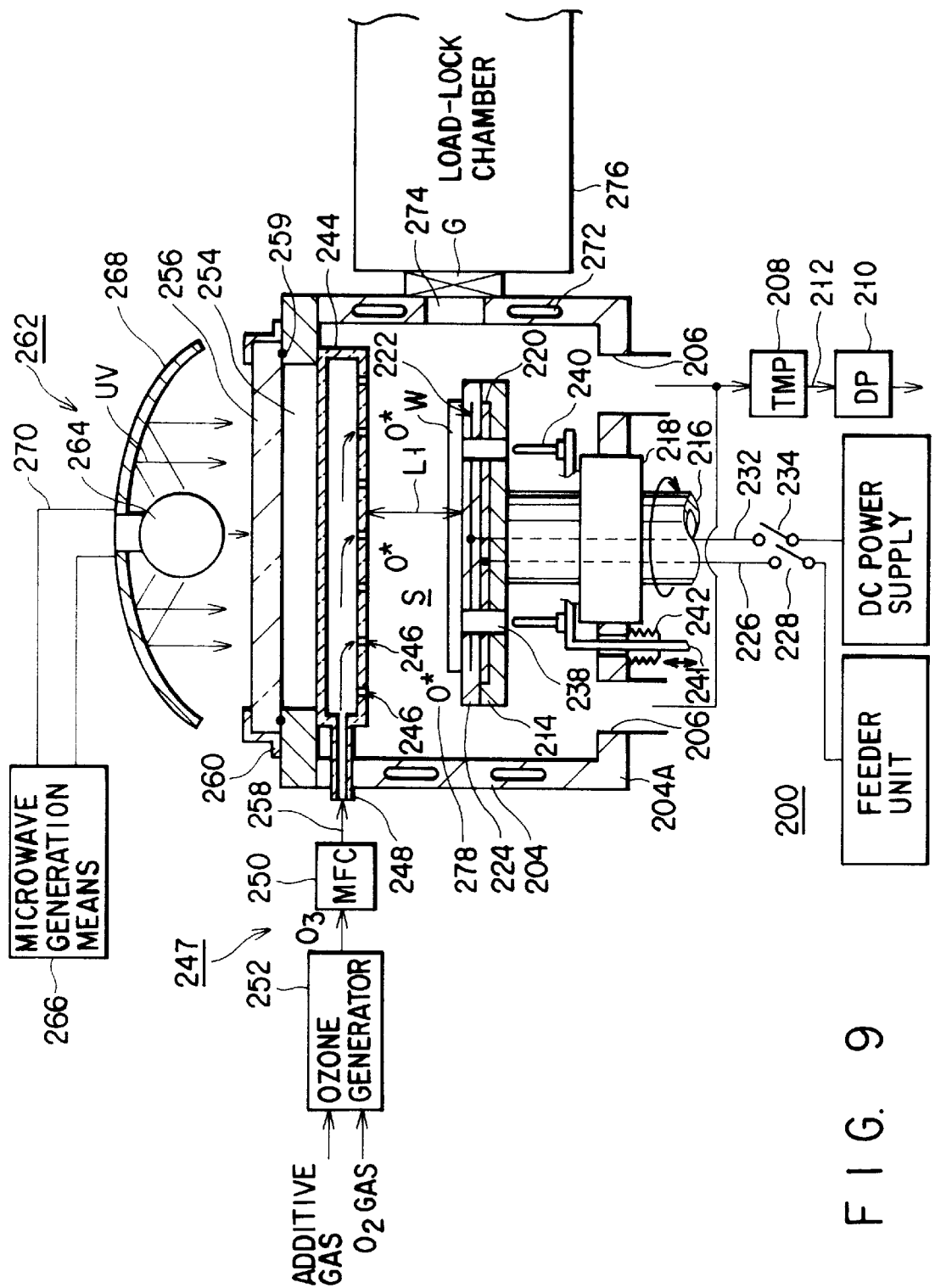
FIG. 9 is a view showing a film modifying apparatus according to the first embodiment of the second aspect.

FIG. 9 is a view showing a film modifying apparatus according to the first embodiment of the second aspect. In this embodiment, a semiconductor wafer is used as the target process object, and a tantalum oxide film ($Ta_2O_5$) formed on the surface of the semiconductor wafer as a metal oxide film is modified.

As shown in FIG. 9, a film modifying apparatus 200 has a process vessel 204 of, e.g., aluminum formed into a cylindrical shape. A plurality of exhaust ports 206 are formed at the peripheral portion of a bottom portion 204A of the process vessel 204. A vacuum evacuation system 212 having vacuum pumps, e.g., a turbo molecular pump (TMP) 208 and a dry pump (DP) 210 is connected to the exhaust ports 206 such that the vessel can be vacuum-evacuated.

A disk-shaped mounting table 214 consisting of a non-conductive material such as alumina is arranged in the process vessel 204. The central portion of the lower surface of the mounting table 214 is supported and fixed on the distal end of a hollow rotating shaft 216 which extends through the bottom portion 204A of the vessel. A magnetic fluid seal 218 is arranged at a portion where the rotating shaft 216 extends through the bottom portion of the vessel such that the rotating shaft 216 can be hermetically rotated. With this arrangement, the mounting table 214 can be rotated as needed. The rotating shaft 216 can be rotated by a driving force from a rotating motor (not shown) or the like.

A heating resistor 220 consisting of carbon coated with, e.g., SiC is buried in the mounting table 214 as a mounting table heating means such that a semiconductor wafer W as a target process object mounted on the upper surface of the mounting table can be heated to a predetermined temperature. The upper portion of the mounting table 214 is constituted as a thin electrostatic chuck 224 consisting of a ceramic in which a chuck electrode 222 made of a conductive plate of, e.g., copper is buried. The wafer W is chucked and held on the upper surface of the mounting table 214 by a Coulomb's power generated by the electrostatic chuck 224. A backside gas such as the gas may be flowed to the surface of the electrostatic chuck 224 to improve the thermal conductivity to the wafer.

An insulated lead line 226 for feeding is connected to the heating resistor 220. The lead line 226 is externally extracted from the process vessel 204 through the hollow rotating shaft 216 without being exposed to the atmosphere in the process vessel 204, and connected to a feeder unit 230 through an opening/closing switch 228. An insulated lead lien 232 for feeding is connected to the chuck electrode 222 of the electrostatic chuck 224. The lead lien 232 is also externally extracted from the process vessel 204 through the hollow rotating shaft 216 without being exposed to the atmosphere in the process vessel 204, and connected to a high-voltage DC power supply 236 through an opening/closing switch 234. The wafer may be heated using a heating lamp such as a halogen lamp in place of the heating resistor 220.

A plurality of lifting holes 238 extend through the mounting table 214 at predetermined positions of the peripheral portion. Wafer lifting pins 240 capable of moving upward/downward are arranged in correspondence with the lifting holes 238. The wafer lifting pins 240 can be integrally moved upward/downward by a pin elevating rod 241 capable of moving upward/downward through the vessel bottom portion 204A. An extendible bellows 242 made of a metal is arranged at the extended portion of the rod 241 such that the rod 241 can move upward/downward while keeping the hermetic properties. The wafer W is moved upward/downward by moving the pins 240 upward/downward. Generally, three wafer lifting pins 240 are arranged in correspondence with the peripheral portion of the wafer.

A thin container-shaped shower head 244 consisting of a heat resistant material transparent to a UV ray (to be described later), e.g., molten silica glass is arranged at the ceiling portion of the process vessel 204. A number of injection holes 246 are formed in the lower surface of the shower head 244 to inject a processing gas supplied into the shower head 244 to a process space S. A gas introduction port 248 of the shower head 244 hermetically extends through the side wall of the vessel and is opened to the outside. The gas introduction port 248 is connected to a gas introduction pipe 258 of a process gas supply means 247.

A known ozone generator 252 is connected to the gas introduction pipe 258 through a mass flow controller (MFC) 250. Ozone generated by the ozone generator 252 is supplied to the shower head 244 as a process gas. To generate ozone, not only the oxygen gas but also a small quantity of an additive gas such as $N_2$ gas or a gas mixture of $N_2$ gas and $H_2$ gas is supplied to the ozone generator 252 to increase the generation efficiency. Instead of ozone, $N_2O$ gas may be used as the process gas. A distance L1 between the shower head 244 and the mounting table 214 is set to be about 50 mm to ensure a space for introducing/delivering the wafer. In the process, the wafer can be moved upward/downward to make the wafer close to the shower head. In this case, the distance can be changed within the range of 1 to 50 mm.

A circular opening 254 having a diameter larger than the wafer size is formed at the ceiling portion of the process vessel 204. A circular transmission window 256 formed of a material transparent to a UV ray, e.g., silica glass is hermetically attached to the opening 254 through a fixing frame 260 while a sealing member 259 such as an O-ring is provided between the transmission window 256 and the ceiling portion. The thickness of the transmission window 256 is set to be about 20 mm such that the transmission window 256 can stand the atmospheric pressure.

A UV irradiation means 262 is arranged above the transmission window 256 to emit a UV ray into the process vessel 204. Active oxygen atoms are generated by the emitted UV ray. More specifically, the UV irradiation means 262 is mainly constituted by a mercury-sealed lamp 264 in which mercury is sealed, a microwave generation means 266 for generating a microwave to be irradiated on the lamp 264, and a reflecting mirror 268 covering the upper side of the lamp 264 to reflect the UV ray toward the process vessel 204.

The microwave generation means 266 generates a microwave having a frequency of, e.g., 2.45 GHz. The microwave generation means 266 and the mercury-sealed lamp 264 are connected through a waveguide 270. With this arrangement, the generated microwave propagates to the lamp 264 through the waveguide 270 and is irradiated on the lamp 264 to generate a UV ray. The mercury-sealed lamp 264 is different from a normal cold cathode tube in that the mercury-sealed lamp 264 can be applied with a large power to generate a UV ray. The reflecting mirror 268 is constituted by forming, e.g., an aluminum plate into a dome shape. The curvature of the reflecting mirror 268 is set such that the reflected UV ray can be substantially uniformly reflected to the surface of the mounting table 214 by the mirror 268. An excimer lamp for emitting a large quantity of UV rays having a wavelength of 180 nm or less at which the active oxygen atom generation efficiency is high may be used in place of the mercury-sealed lamp 264.

A cooling jacket 272 in which, e.g., a refrigerant flows is provided in the side wall of the process vessel 204 to cool the side wall. A cool water at, e.g., 20° C. is flowed in the cooling jacket 272 as a refrigerant. A wafer loading/unloading port 274 is formed in part of the vessel side wall. A gate valve G is provided at the wafer loading/unloading port 274 to connect/shield the wafer loading/unloading port 274 to/from a load-lock chamber 276 which can be vacuum-evacuated. Although not illustrated, an $N_2$ gas supply means for purging is provided to the process vessel 204, as a matter of course. This structure also applies to process vessels to be described later.

A film modifying method according to the second aspect will be described below on the basis of the film modifying apparatus 200 having the above arrangement.

Before the modification process is performed using the film modifying apparatus 200, a metal oxide film such as a tantalum oxide film is formed on the surface of the wafer W in the previous process. This metal oxide film is used as a capacitance or gate insulating film in an integrated circuit.

The semiconductor wafer W having the metal oxide film, which has not been processed yet, is loaded into the process vessel 204 kept in a vacuum state through the wafer loading/unloading port 274 from the side of the load-lock chamber 276. The wafer W is mounted on the mounting table 214 and chucked and held on the mounting table 214 by the Coulomb's power of the electrostatic chuck 224.

The wafer W is kept at a predetermined process temperature by the heating resistor 220. Simultaneously, while the process vessel 204 is vacuum-evacuated and maintained at a predetermined process pressure, ozone ($O_3$) as a process gas is supplied to the process vessel 204 to start the modification process. At this time, the wafer position is set at a predetermined position by an elevating mechanism.

Oxygen and a small quantity of an additive gas, e.g., $N_2$ gas are supplied to the ozone generator 252 of the process gas supply means 247 to generate ozone. A gas mixture of ozone as a major component, oxygen, and $N_2$ gas is supplied as a process gas into the shower head 244 through the gas introduction pipe 258 while being flow-controlled, and injected to the process space S through a lot of injection holes 246. The reason why a small quantity of an additive gas is added is that the ozone generation efficiency of the ozone generator 252 is increased as described above.

At the same time, a microwave having a frequency of, e.g., 2.45 GHz is generated from the microwave generation means 266 of the UV irradiation means 262. This microwave propagates through the waveguide 270 and is irradiated on the mercury-sealed lamp 264. Upon irradiation of the microwave, a large quantity of UV rays is emitted from the mercury-sealed lamp 264. The UV ray is transmitted through the transmission window 256 of silica glass directly or after reflected by the dome-shaped reflecting mirror 268, and enters the process vessel 204 which is maintained at a predetermined vacuum pressure. The UV ray is further transmitted through the shower head 244 of silica glass and irradiated on the process gas mainly containing ozone in the process space S. The pressure in the shower head is reduced but higher than that in the process chamber.

The ozone is excited upon irradiation of the UV ray to generate a lot of active oxygen atoms 278. The active oxygen atoms 278 act on the metal oxide film formed on the wafer surface and substantially completely oxidize the metal oxide film, thus modifying the metal oxide film. In this case, since the process vessel 204 is maintained in the vacuum state, the generated active oxygen atoms 278 are less likely to collide with other gas atoms or molecules. Accordingly, the density of the active oxygen atoms 278 becomes higher than that in the conventional apparatus which performs the process under the atmospheric pressure, so that the modification process can be quickly performed. With this modification process, the insulating properties of the metal oxide film can be quickly and largely improved.

The curvature of the dome-shaped reflecting mirror 268 of the UV irradiation means 262 is appropriately set such that the distribution of light reflected by the reflecting mirror 268 substantially becomes uniform on the surface of the mounting table 214. For this reason, the generated UV ray can be efficiently used to generate the active oxygen atoms 278.

During the modification process, the mounting table 214 supported by the rotating shaft 216 integrally rotates the wafer W mounted on the mounting table 214. With this arrangement, variations in modification on the wafer surface can be prevented, and the entire surface of the metal oxide film can be substantially uniformly modified.

The pressure in the vessel during the modification process is set within the range of 1 to 600 Torr. Outside this range, the progress of modification is slow or insufficient, and the breakdown voltage of the metal oxide film lowers. The wafer temperature during the modification process is set within the range of 320° C. to 700° C. When the wafer temperature is lower than 320° C., the breakdown voltage is insufficient. When the wafer temperature exceeds 700° C., the oxidized substances are crystallized, and the modification effect cannot be obtained.

Since the mercury-sealed lamp 264 used in this embodiment can receive a large power, the mercury-sealed lamp 264 can emit a large quantity of UV rays mainly having a wavelength of 185 or 254 nm which can contribute to activation of the gas. Accordingly, the modification process can be quickly performed. When an excimer lamp which emits a large quantity of UV rays having a wavelength of 180 nm or less which can further contribute to activation of the gas is used in place of the mercury-sealed lamp 264, the speed of the modification process can be expected to be higher than the mercury-sealed lamp 264.

The additive gas is not limited to the above-described $N_2$ gas. Alternatively, a gas mixture of $N_2$ gas and $H_2$ gas may be used. As the process gas, $N_2O$ gas may be supplied to the shower head 244, in place of ozone, to obtain the same functions/effects as described above.

Figure 10:
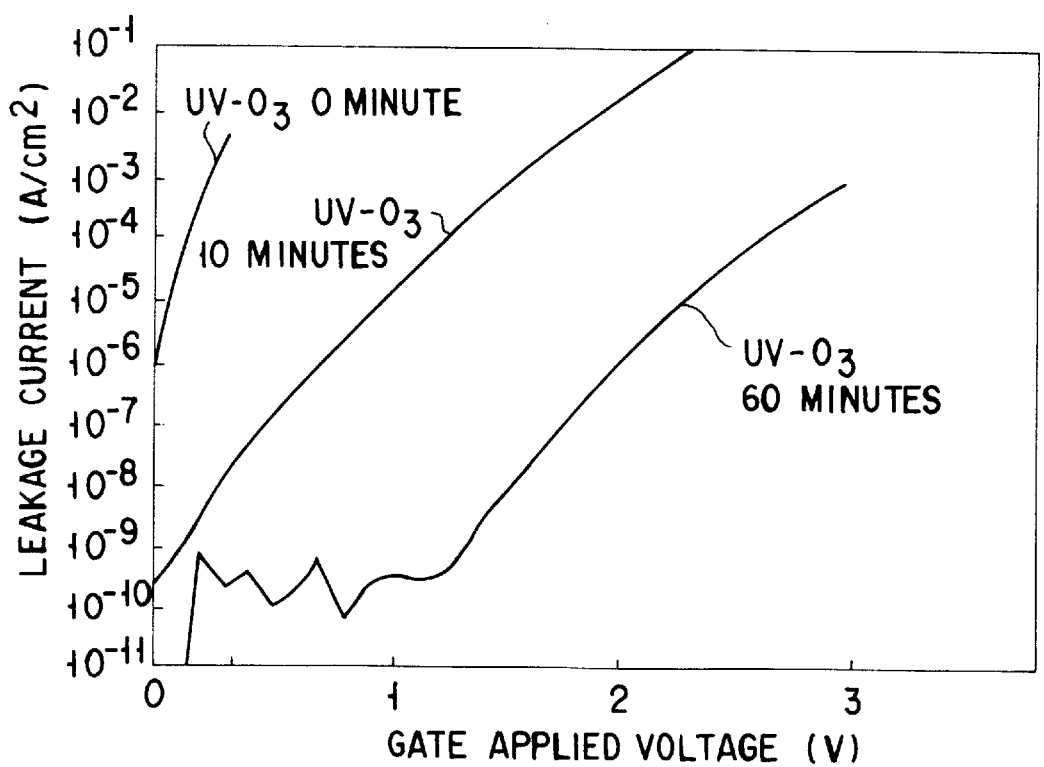
FIG. 10 is a graph showing the relationship between the irradiation time and the insulating characteristics, which is observed when a UV ray is irradiated in an ozone atmosphere in the film modifying apparatus shown in FIG. 9.

Known experimental results associated with modification will be described below in detail with reference to graphs. FIG. 10 is a graph showing the relationship between the UV irradiation time in the ozone atmosphere and the insulating characteristics (leakage current) in the film modifying apparatus 200. The process pressure during the modification process is 760 Torr. The metal oxide film is used as a gate insulating film.

Referring to FIG. 10, as the modification process time increases from 0 to 10, or 60 minutes, the leakage current decreases, and the breakdown voltage for the applied gate voltage gradually raises, indicating that the characteristics are gradually improved. Therefore, it is found that the modification process using UV irradiation in the ozone atmosphere is very effective.

FIG. 11 is a graph showing the relationship between the process pressure during the process using UV irradiation in the ozone atmosphere in the film modifying apparatus 200 and the breakdown voltage. The modification process time is 5 minutes. As represented by the solid line in FIG. 11, when the process pressure falls within the range of 1.0 to 600 Torr, the breakdown voltage is higher than a reference breakdown voltage of 2.0 V, showing satisfactory characteristics. The characteristics are most satisfactory within the rang of about 5.0 to 200 Torr centered on about 10.0 Torr. The alternate long and dashed line in FIG. 11 represents characteristics observed when the modification process is not performed. As a result, modification in the vacuum can be performed in a shorter time than that under the atmospheric pressure.

In the process under the atmospheric pressure, the distance between the shower head and the wafer must be reduced such that even active oxygen having a short life can reach the surface of the wafer W. For this reason, a clearance for moving a robot arm therethrough in loading/unloading of the wafer W can hardly be ensured between the shower head and the mounting table. Therefore, the mounting table must be moved upward/downward to ensure the clearance. In the vacuum, however, even when the distance between the shower head and the mounting table is large, the same effect as under the atmospheric pressure can be obtained. This is because the life of the generated active oxygen atoms is prolonged in the vacuum, and an abundant supply of active oxygen atoms to the surface of the wafer W is ensured. As described above, in the film modifying apparatus 200 according to the second aspect, the distance L1 between the shower head 244 and the wafer W can sufficiently increase such that the robot arm can move in loading/unloading of the wafer W. Therefore, the elevating mechanism for moving the mounting table 214 upward/downward can be omitted.

FIG. 12 is a graph showing the result of a modification process in which a tantalum oxide film was modified using a UV ray under a low pressure in the film modifying apparatus 200. This graph shows the results of a 3-minute process and a 10-minute process and additionally, the results of a 10-minute process and a 60-minute process under the atmospheric pressure. The temperature was 400° C., and the pressure was 1 Torr. As is apparent from FIG. 12, characteristics obtained in the 60-minute process under the atmospheric pressure exhibits substantially the same curve as that in the 10-minute process under the low pressure in the present invention. Therefore, according to the present invention, the same effect as in the prior art can be obtained by a short-time process for a time about ⅙ that of the conventional atmospheric pressure process.

Figure 13:
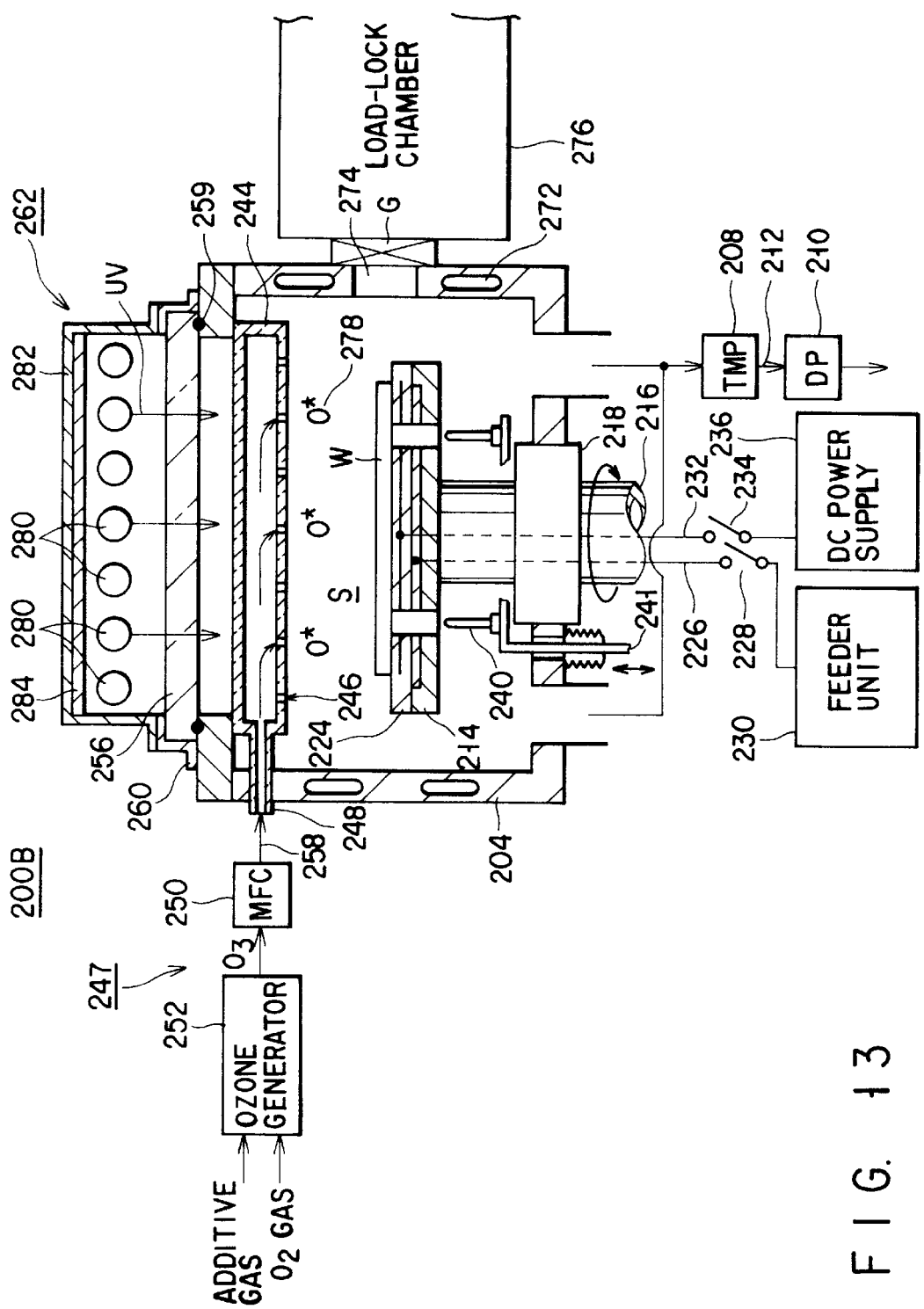
FIG. 13 is a view showing a film modifying apparatus according to the second embodiment of the second aspect.

In the first embodiment of the second aspect, the mercury-sealed lamp which emits a UV ray upon irradiation of a microwave is used as the UV irradiation means. In place of this mercury-sealed lamp, a normal UV lamp which emits a UV ray without using any microwave may be used. FIG. 13 is a view showing such a film modifying apparatus 200B. The same reference numerals as in FIG. 9 denote the same parts in FIG. 13, and a detailed description thereof will be omitted. More specifically, in this arrangement, a UV irradiation means 262 has a plurality of cylindrical UV lamps 280. In this case, seven UV lamps 280 are arrayed in parallel outside a transmission window 256 made of silica glass to oppose the mounting surface of a mounting table 214. The number of UV lamps 280 is merely an example and can be appropriately increased to obtain a desired UV intensity. As such a UV lamp, a cold cathode tube capable of emitting a large quantity of UV rays with a power as small as 20 W can be used. The shape of the UV lamp 280 is not limited to the linear cylindrical shape. For example, a linear cylindrical lamp can be bent and deformed info a U, W, or zigzagged shape and used.

The plurality of UV lamps 280 are entirely covered with a case 282. A reflecting mirror 284 is arranged inside the case 282 to reflect a UV ray emitted upward from the lamp to the lower side.

The film modifying apparatus 200B according to the second embodiment of the second aspect also exhibits the same functions/effects as those of the film modifying apparatus 200 according to the first embodiment shown in FIG. 9. When UV rays emitted from the UV lamps 280 are irradiated on a process space S through the transmission window 256 and a shower head 244, a process gas such as ozone which exits in the process space S is activated to generate active oxygen atoms 278. The active oxygen atoms 278 act on the metal oxide film formed on the surface of a semiconductor wafer W to completely oxidize the metal oxide film, thus modifying the metal oxide film.

The film modifying apparatus 200B according to the second embodiment shown in FIG. 13 uses no microwave generation means, unlike the film modifying apparatus 200 shown in FIG. 9. Therefore, the structure can be simplified, and accordingly, the cost can be reduced.

In the first and second embodiments shown in FIGS. 9 and 13, the shower head 244 has a structure for supplying ozone into the disk-shaped container. However, when the pressure of ozone in the shower head 244 is relatively high, the UV ray may be absorbed in the ozone in the shower head 244 and cannot reach the wafer surface, or active oxygen atoms generated in the shower head 244 may be less likely to reach the wafer surface without vanishing.

The shower head 244 may be constituted by a plurality of gas injection pips arrayed in a matrix shape, as shown in FIGS. 14 and 15. FIG. 14 is a view showing the main part of a film modifying apparatus according to the third embodiment of the second aspect. FIG. 15 is a bottom view showing the shower head of the film modifying apparatus shown in FIG. 14. The same reference numeral as in the above-described embodiments denote the same parts in this modification, and detailed description thereof will be omitted. In this modification, only the main part will be described. The remaining portions have the same structures as in FIGS. 9 and 11.

As shown in FIG. 14, a film modifying apparatus 200C according to the third embodiment uses low-pressure mercury lamps as UV lamps 280. The lamps 280 are arranged above a transmission window 256. The transmission window 256 passes 90% or more of UV rays with a wavelength of, e.g., 254 nm, which are generated from the UV lamps 280.

A shower head 244 consisting of silica glass which passes 90% or more of UV rays, like the material of the transmission window 256, is arranged immediately under the transmission window 256. More specifically, the shower head 244 is constituted by a large-diameter ring-shaped distribution ring pipe 310 having a diameter larger than the diameter of a wafer W, and a plurality of gas injection pipes 312 which are arrayed and connected in a matrix shape in the distribution ring pipe 310, as shown in FIG. 15. In this case, the inner diameters of the ring pipe 310 and the gas injection pipe 312 are 16 mm and 4.35 mm, respectively. A lot of injection holes 246 each having a diameter of about 0.3 to 0.5 mm are formed on the lower surface side of the gas injection pipes at an equal pitch such that a process gas containing ozone can be injected.

In this case, it is preferable that the projection area of the gas injection pipes 312 with respect to the wafer W on the mounting table 214 be set to be smaller than 20% of the surface area of the wafer. With this structure, ore UV rays are transmitted through space portions 314 among the gas injection pipes 312 having a matrix shape and directly irradiated on the wafer surface.

In the above arrangement, the process gas containing ozone and supplied into the shower head 244 circulates along the ring-shaped distribution ring pipe 310 and flows into the gas injection pipes 312. The process gas is supplied from the large number of injection holes 246 formed in the gas injection pipes 312 into a process vessel 204, so that the ozone gas can be uniformly supplied to the wafer surface.

The space portions 314 are formed among the gas injection pipes 312 having a matrix structure, and many UV rays pass through the space portions 314. Many UV rays are directly irradiated on the wafer surface without interfering with ozone in the shower head 244. Accordingly, the number of active species on the wafer surface increases, and modification can be efficiently performed. Particularly, when the projection area of the gas injection pipes 312 is set to be smaller than 20% of the wafer surface, i.e., when the aperture ratio, i.e., the area ratio of the space portions 314 is set to be 80% or more, the modification process can be satisfactorily performed to obtain an insulating film having satisfactory properties.

When the mounting table 214 rotates during the modification process, the modification process can be uniformly performed on the entire wafer surface.

FIG. 16 is a graph showing the relationship between the aperture ratio (100—projection area percentage) of the gas injection pipes and the breakdown voltage in the film modifying apparatus 200C according to the third embodiment. The thickness of the $Ta_2O_5$ film is 10 nm. As is apparent from FIG. 16, when the aperture ratio is 80% or less, i.e., the projection area percentage is smaller than 20%, the breakdown voltage is 1.8 V or more. It is confirmed that a satisfactory insulating film can be formed by the apparatus 200C.

When the film modifying apparatus 200C of the third embodiment was used to perform the process under conditions that the wafer temperature was 400° C., the process pressure was 1 Torr, and the concentration of ozone was 150 g/m$^3$. To obtain the current vs. voltage characteristics in the 10-minute process under a low pressure, which are shown in FIG. 12, the process needed be performed only for 5 minutes or less, and the process could be efficiently performed. Even when this process was performed at a degree of vacuum of 1 to 500 Torr, the same remarkable film quality improvement effect as described above could be obtained.

In the third embodiment, the plurality of gas injection pipes 312 are arranged in a matrix shape. As far as the space portions 314 can ensure a predetermined area, the shape and array of these gas injection pipes are not limited. For example, the gas injection pipes may be linearly arranged in parallel, or concentrically or spirally arrayed.

Figure 18:
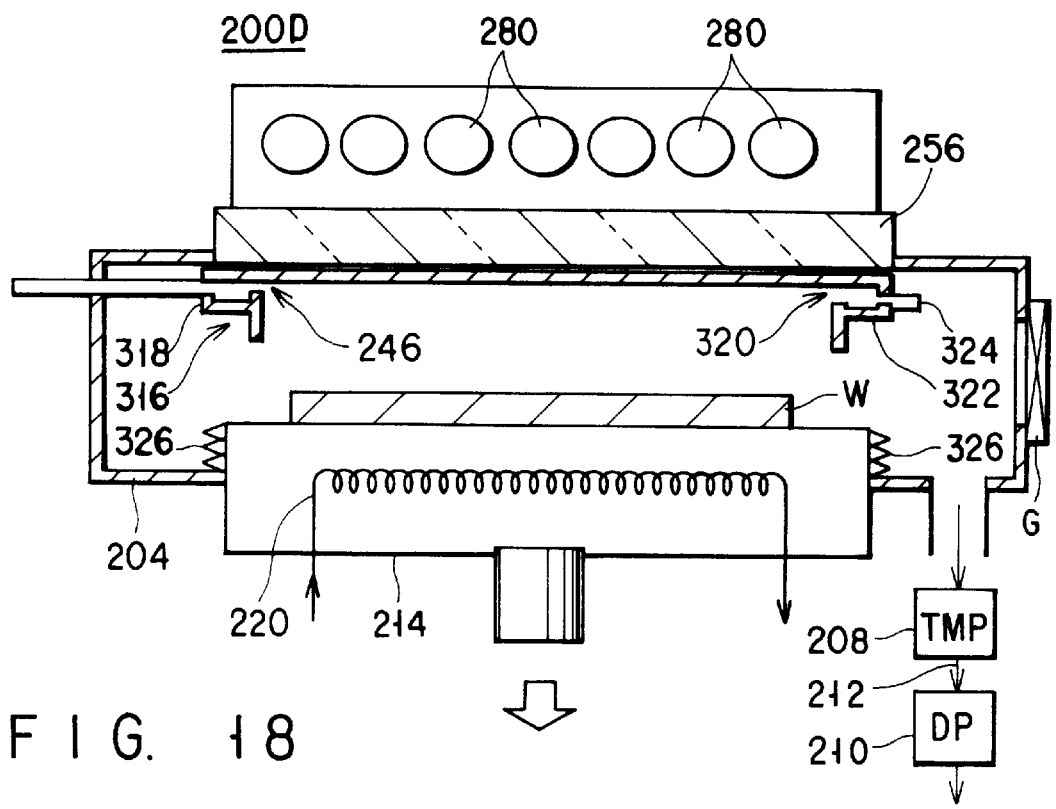
FIG. 18 is a view showing a state wherein the mounting table of the film modifying apparatus shown in FIG. 17 is moved downward.
Figure 19:
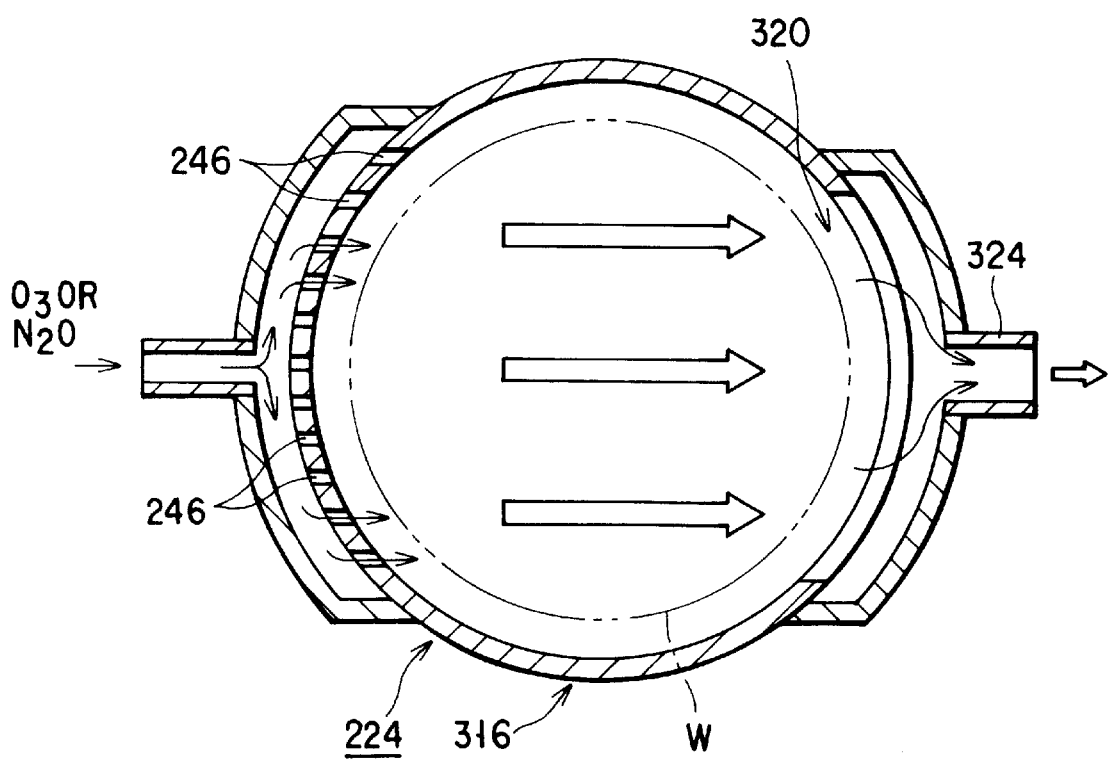
FIG. 19 is a sectional view showing the shower head of the film modifying apparatus shown in FIG. 17.

In the film modifying apparatuses 200, 200B, and 200C of the first to third embodiments shown in FIGS. 9, 13, 14, and 15, the ozone or $N_2O$ gas is supplied to the entire region in the process vessel 204. However, the ozone may be locally supplied, as shown in FIGS. 17 to 19. FIG. 17 is a view showing the main part of a film modifying apparatus 200D according to the fourth embodiment of the second aspect. FIG. 18 is a view showing a state wherein a mounting table 214 of the film modifying apparatus 200D shown in FIG. 17 is moved downward. FIG. 19 is a sectional view showing a shower head 244 of the film modifying apparatus 200D shown in FIG. 17.

The same reference numerals as in the embodiments shown in FIGS. 9, 13, and 14 denote the same parts in the fourth embodiment, and a detailed description thereof will be omitted. In this embodiment, only the main part will be described. The remaining portions have the same structures as in FIGS. 9, 13 and 14.

As shown in FIGS. 17 to 19, the shower head 244 has a circular container-shaped lid 316 having an lower open end portion to cover the upper surface of the mounting table 214. The diameter of the lid 316 is slightly larger than that of a wafer W and slightly smaller than that of the mounting table 214. The lid 316 is entirely formed of silica glass having UV transmission properties. A circular arc introduction header unit 318 having a number of injection holes 246 formed in the horizontal direction is arranged on one side of the lid 316, and a gas introduction pipe 258 is connected to the introduction head unit 318. A delivery header unit 322 having a delivery port 320 is arranged on the other side of the lid 316 such that a gas flow can be formed in the horizontal direction in the lid 316. The delivery port 320 is formed into a circular arc slit shape along the side wall of the lid 316 such that a uniform horizontal gas flow is formed. An opening 324 opened to a process vessel 204 is formed in the side surface of the delivery header unit 322.

To load or unload the wafer W, the mounting table 214 can be moved upward/downward by a small distance by an elevating mechanism (not shown) while keeping the vacuum state in the process vessel. With this structure, the mounting table 214 can be made close to or separated from the lid 316. FIG. 18 shows a state wherein the mounting table 214 is moved downward. To maintain the vacuum state in the process vessel 204, e.g., a bellows 326 is arranged around the mounting table 214. Not the mounting table 214 but the lid 316 may be moved upward/downward.

In the state shown in FIG. 17 of the fourth embodiment, the process gas containing ozone and supplied to the introduction header unit 318 flows from the injection holes 246 formed in the introduction header unit 318 into the lid 316. The process gas forms a horizontal gas flow flowing into delivery header unit 322 on the opposite side. This flowing gas flows into the vacuum-evacuated process vessel 204 through the opening 324.

In this case, active oxygen atoms at a high concentration can be generated in a small space in the lid 316 and particularly, at a portion near the surface of the wafer W. For this reason, the modification process can be efficiently performed, and additionally, a modified film having more satisfactory characteristics can be obtained. The lower end portion of the lid 316 is set to be in contact with the upper peripheral portion of the mounting table 214 or separated from the upper peripheral portion of the mounting table 214 only by a small distance. In this case as well, when the mounting table 214 is rotated during the modification process, the wafer surface can be further uniformly modified. When the mounting table 214 is divided into the peripheral portion and the central portion, and the ring-shaped peripheral portion contacting the lid 316 is constituted as a fixed mounting table having a ring shape, the process can be performed while the wafer W is rotated, and the lower end portion of the lid 316 is kept in contact with the fixed mounting table. In addition, the gas can be prevented from leaking from portions other than the opening 324. Therefore, the concentration of the active oxygen atoms in the lid 316 can be further increased.

With this arrangement, a remarkable film quality improvement effect could be obtained at a degree of vacuum of 1 to 500 Torr.

The process was performed under the conditions that the wafer temperature was 400° C., the process pressure was 1 Torr, and the concentration of ozone was 150 g/m$^3$. To obtain the current vs. voltage characteristics in the 10-minute process under a reduced pressure, which are shown in FIG. 12, the process needed be performed only for 4 minutes or less, and the process could be efficiently performed.

In the above-described first to fourth embodiments, the UV lamps 280 constituting the UV irradiation means 262 are arranged outside the process vessel 204. The arrangement is not limited to this, and the UV lamps 280 may be arranged inside the process vessel 204. FIG. 20 is a view showing such a film modifying apparatus 200E according to the fifth embodiment. The same reference numerals as in FIG. 13 denote the same parts in FIG. 20, and a detailed description thereof will be omitted. In the film modifying apparatus 200E, UV lamps 280 constituting a UV irradiation means 262 are arranged in parallel immediately under a shower head 244 in a process vessel 204. Therefore, the transmission window 256 consisting of silica glass which is necessary for the arrangement shown in FIG. 13 can be omitted. A reflecting mirror 284 is arranged at the ceiling portion of the vessel where the shower head 244 is attached to reflect UV rays emitted from the lamps 280 to the lower side, so that the UV rays can be efficiently used.

The film modifying apparatus 200E according to the fifth embodiment having the above arrangement also exhibits the same functions/effects as those of the film modifying apparatus 200B shown in FIG. 13. UV rays emitted from the UV lamps 280 are irradiated on a process gas such as ozone which exists in a process space S to generate active oxygen atoms 278. The active oxygen atoms 278 act on the metal oxide film formed on the surface of a semiconductor wafer W to substantially completely oxidize the metal oxide film, thus modifying the metal oxide film.

In the film modifying apparatus 200E of the fifth embodiment, since the UV lamps 280 are accommodated in the process vessel 204, the lamps 280 can be made close to the wafer W. Accordingly, the UV rays emitted from the lamps 280 can be efficiently used to increase the speed of the modification process. In addition, unlike the film modifying apparatus 200B according to the second embodiment shown in FIG. 13, light emitted from the lamps is not absorbed by the silica glass window and weakened. Furthermore, since the shower head can be kept from a mounting table 214 having a heating resistor 220, decomposition of ozone or N$_2$O gas due to the heat of the wafer W can be suppressed.

In the fifth embodiment, the reflecting mirror 284 is provided at the ceiling portion of the vessel. When the reflecting mirror 284 is to be omitted, the shower head 244 may be formed of not silica glass which is transparent to UV rays but normal stainless steel or anodized aluminum with an anodic oxidation coating may be used. In this case, an increase in cost can be suppressed as compared to a case wherein the shower head of silica glass, which is relatively difficult to manufacture, is used.

Figure 21:
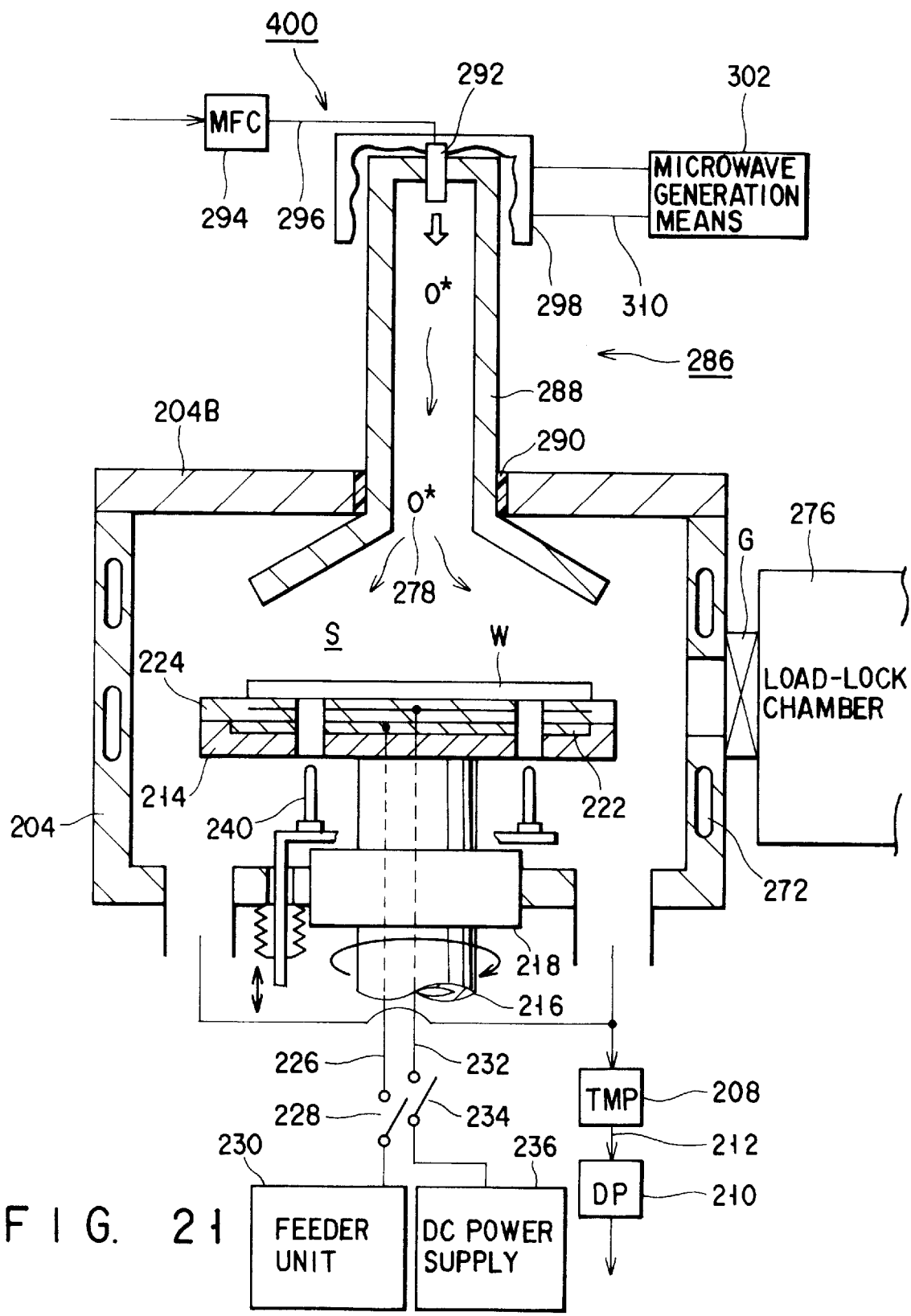
FIG. 21 is a view showing a film modifying apparatus according to the sixth embodiment of the second aspect.

In the above first to fifth embodiments, UV rays are irradiated on ozone or N$_2$O gas to generate active oxygen atoms. Instead, oxygen or N$_2$O gas may be excited by a plasma to generate active oxygen atoms. FIG. 21 is a view showing such a film modifying apparatus 400 according to the sixth embodiment of the second aspect. The same reference numerals as in the film modifying apparatus 200 according to the first embodiment shown in FIG. 9 denote the same parts in FIG. 21, and a detailed description thereof will be omitted.

The sixth embodiment is characterized in that a plasma generation means 286 is used in place of the UV irradiation means 262 used in the first to fifth embodiments. More specifically, the plasma generation means 286 has a plasma generation vessel 288 consisting of, e.g., silica glass. The plasma generation vessel 288 is formed into a hollow cylindrical shape, and its lower portion is enlarged into a funnel shape. The plasma generation vessel 288 extends through the central portion of a ceiling portion 204B of a process vessel 204, and its opening portion opposes the mounting surface. A sealing member 290 is arranged between the penetrating portion of the plasma generation vessel 288 and the ceiling portion 204B, thereby keeping hermetic properties therebetween. Therefore, the plasma generation vessel 288 communicates with the process vessel 204 so that the plasma generation vessel 288 constitutes part of the process space.

A process gas introduction nozzle 292 is provided at the ceiling portion of the plasma generation vessel 288. A gas supply pipe 296 is connected to the nozzle 292 through a mass flow controller (MFC) 294 so that a process gas can be flow-controlled and supplied into the plasma generation vessel 288. As the process gas, not only ozone or $N_2O$ gas used in the first to fifth embodiments but also oxygen gas can be used. A small quantity of $N_2O$ gas or a gas mixture of $N_2$ gas and $H_2$ gas may be added as an additive gas.

The upper portion of the plasma generation vessel 288 is covered with a microwave reception unit 298 consisting of a conductive material. This reception unit 298 is connected to a microwave generator 302 for generating a microwave having a frequency of, e.g., 2.45 GHz through a waveguide 300. The microwave directly acts on the process gas to generate active oxygen atoms.

In this arrangement as well, the same effects/functions as those of the film modifying apparatus 200 according to the first embodiment can be obtained. More specifically, the process gas is supplied into the plasma generation vessel 288 through the process gas introduction nozzle 292, and a microwave having a frequency of 2.45 GHz, which is generated by the microwave generator 302, is directly irradiated on the process gas, thereby generating a plasma. Active oxygen atoms 278 are generated by the energy of the plasma. The generated active oxygen atoms 278 flow downward in the plasma generation vessel 288 and are supplied from the enlarged lower end of the plasma generation vessel 288 onto the entire surface of a wafer. The active oxygen atoms substantially completely oxidizes the metal oxide film formed on the wafer surface in a short time, thus modifying the metal oxide film.

The pressure during the modification process is preferably set within the range of 0.1 to 5.0 Torr in consideration of the generation efficiencies of the plasma and the active oxygen atoms 278. The wafer process temperature is preferably set within the range of 320° C. to 700° C. Particularly, as the temperature is higher, a larger effect can be obtained.

Figure 22:
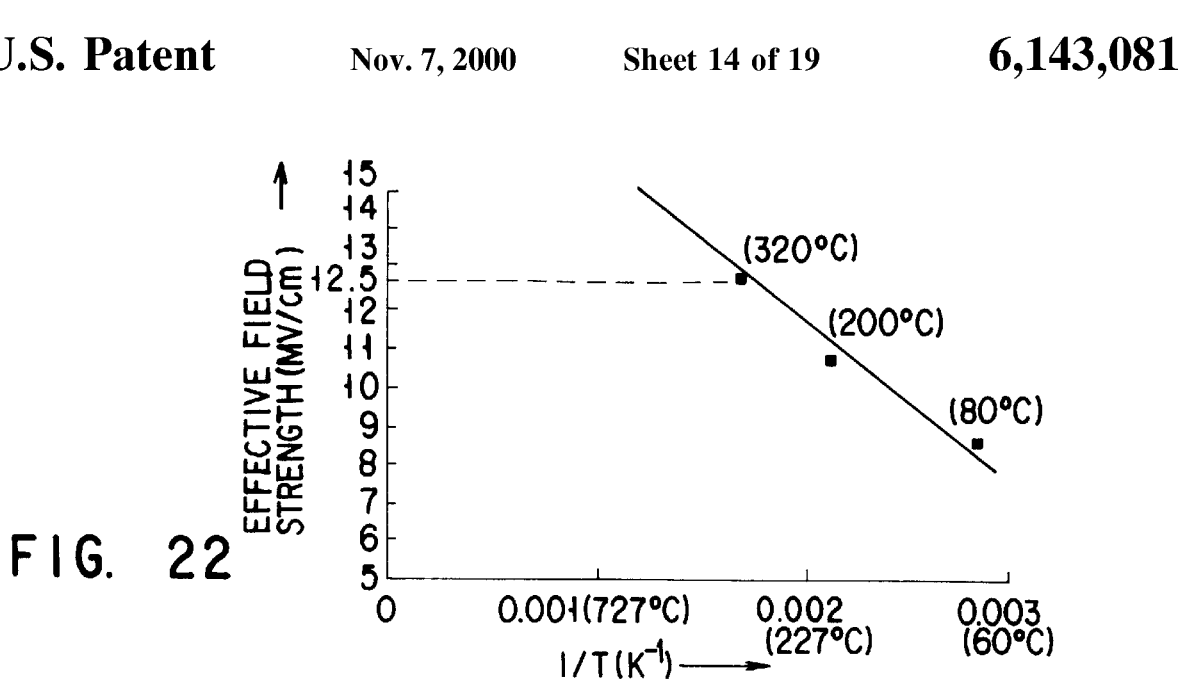
FIG. 22 is a graph showing the dependency of the breakdown voltage on the active oxygen process temperature in the film modifying apparatus shown in FIG. 21.

FIG. 22 is a graph showing the dependency of the breakdown voltage on the active oxygen process temperature in the film modifying apparatus 400 according to the sixth embodiment. The abscissa represents the reciprocal of the absolute temperature, and the ordinate represents the effective field strength. The modification process pressure is 1.0 Torr, and the modification process time is 10 minutes. As is apparent from FIG. 22, as the modification process temperature increases, a more satisfactory breakdown voltage is obtained. Particularly, to obtain a breakdown voltage corresponding to the lower limit value of the effective field strength, i.e., 12.5 MV/cm or more, the process temperature is preferably set at 320° C. or more. However, since the modification process temperature must be equal to or lower than the film formation temperature of the metal oxide film, the upper limit value of the modification process temperature is 700° C.

Figure 23:
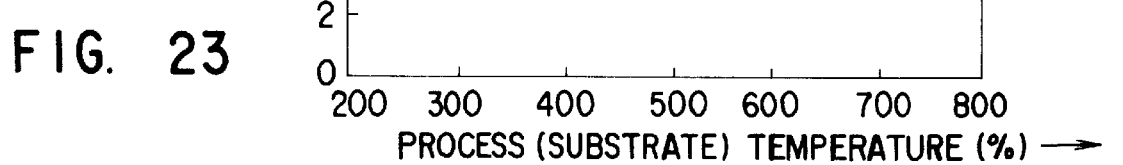
FIG. 23 is a graph showing the dependency of the breakdown voltage on the active oxygen process temperature in the film modifying apparatus shown in FIG. 21.

FIG. 23 shows the dependency of the breakdown voltage on the active oxygen process temperature in the film modifying apparatus 400 according to the sixth embodiment in more detail. In this case, the process pressure is changed from 0.1 Torr to the atmospheric pressure of 760 Torr. As is apparent from FIG. 23, under the atmospheric pressure, as the substrate temperature, i.e., the process pressure becomes higher, a peak value at which the breakdown voltage is maximized is observed, and then, the characteristics abruptly degrade at a process temperature of 700° C. or more. As the process temperature increases, the degree of vacuum at which the breakdown voltage is maximized sequentially lowers. When the process pressure is 760 Torr, the process temperature for giving the highest breakdown voltage is about 300° C.; at 500 to 50 Torr, about 400° C.; at 10 to 1 Torr, about 500° C.; and at 0.5 to 0.1 Torr, about 600° C.

FIG. 23 also indicates that, when the degree of vacuum is about 1 Torr or less, high insulating properties are exhibited at a process temperature of 500° C. to 700° C., and satisfactory characteristics can be obtained.

Figure 24:
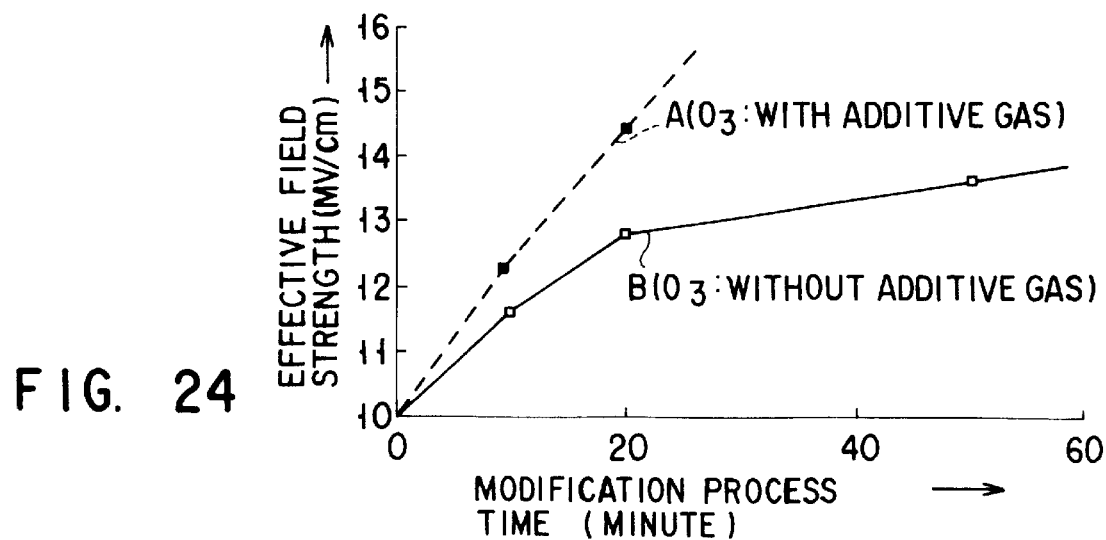
FIG. 24 is a graph showing the dependency of the breakdown voltage on the active oxygen process time in the film modifying apparatus shown in FIG. 21.

FIG. 24 is a graph showing the dependency of the breakdown voltage on the active oxygen process time in the film modifying apparatus 400 according to the sixth embodiment. This graph compares a result obtained by adding an additive gas with a result obtained without adding the additive gas. As is apparent from FIG. 24, when the additive gas is added (curve A), the modification process can be performed in a shorter time than that in case without adding the additive gas (curve B). The reason for this may be considered that the presence of the additive gas increases the concentration of the active oxygen atoms. The additive gas is a gas mixture of $N_2$ gas and $H_2$ gas. The content of this additive gas is about 1 vol. % with respect to $O_2$. The ratio of $N_2$ gas to $H_2$ gas is 97 vol. %: 3 vol. %, and one to two liters of $O_2$ are supplied.

In the sixth embodiment, since a microwave is used to generate a plasma, ozone need not be used, unlike the first to fifth embodiments. Therefore, a failure associated with a gas can be eliminated or a unit for generating ozone can be omitted, and the cost can be largely reduced. The microwave for generating the plasma is not limited to 2.45 GHz, and another high-frequency microwave may be used, as a matter of course.

Figure 25:
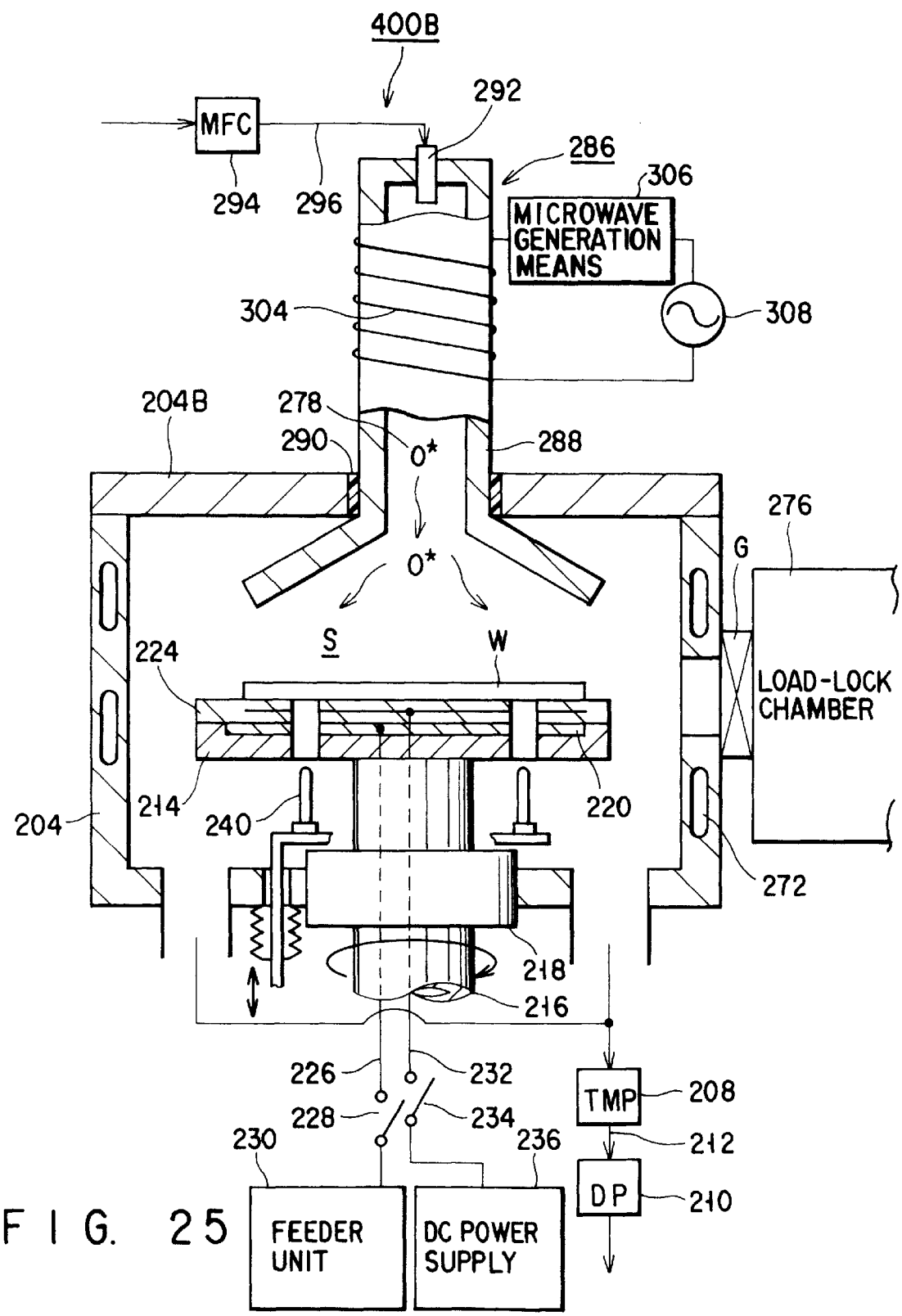
FIG. 25 is a view showing a film modifying apparatus according to the seventh embodiment of the second aspect.

In the sixth embodiment, a microwave is used to generate a plasma. Instead, a high frequency may be used. FIG. 25 is a view showing such a film modifying apparatus 400B according to the seventh embodiment of the second aspect. The same reference numerals as in the film modifying apparatus 400 according to the sixth embodiment shown in FIG. 21 denote the same parts in FIG. 25, and a detailed description thereof will be omitted. More specifically, in the film modifying apparatus 400B according to the seventh embodiment, a high-frequency coil 304 is wound on a plasma generation vessel 288 of a plasma generation means 286. A high-frequency power supply 308 of, e.g., 13.56 MHz is connected to the coil 304 through a matching circuit 306. The high-frequency field is applied to a process gas to generate a plasma.

In the seventh embodiment as well, the same functions/effects as those of the first embodiment shown in FIG. 9 can be obtained. More specifically, a high-frequency field of, e.g., 13.56 MHz is applied from the high-frequency power supply 308 to a process gas supplied into the plasma generation vessel 288 to generate a plasma. Active oxygen atoms 278 are generated by the energy of the plasma. The active oxygen atoms 278 flow downward in the plasma generation vessel 288 to substantially completely modify a metal oxide film on a wafer surface in a short time.

The process pressure and wafer temperature are the same as those in the sixth embodiment shown in FIG. 21. Particularly, in the seventh embodiment, the same effect as in the use of a microwave can be obtained using a high frequency to generate a plasma.

In the first to seventh embodiments, UV rays or a plasma is used in the modification process. When the wafer temperature is set at 400° C. or more, active oxygen atoms can be generated not by using UV rays or plasma but by thermally decomposing ozone on the wafer surface, so that the insulating properties of the tantalum oxide film can be efficiently improved.

Figure 26:
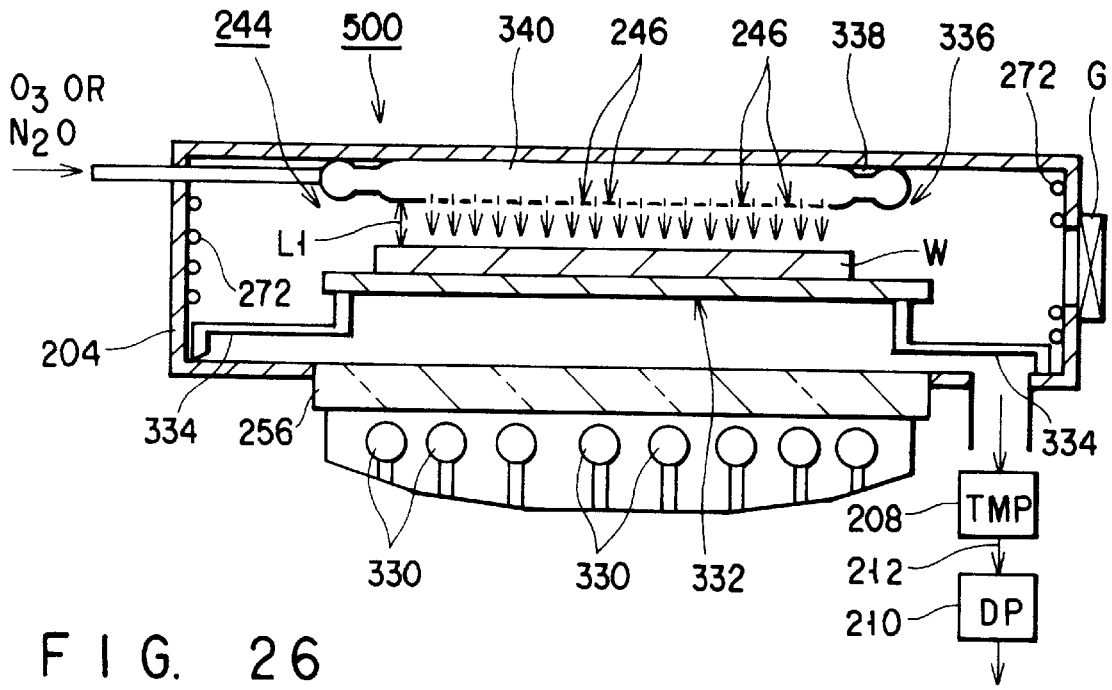
FIG. 26 is a view showing a film modifying apparatus according to the eighth embodiment of the second aspect.
Figure 27:
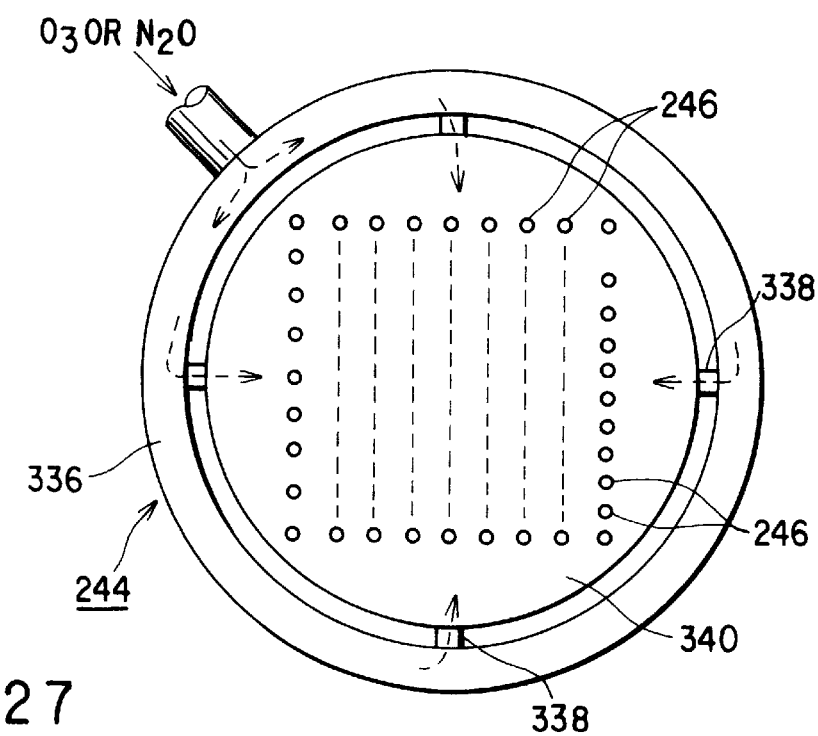
FIG. 27 is a bottom view showing the shower head of the film modifying apparatus shown in FIG. 26.
Figure 28:
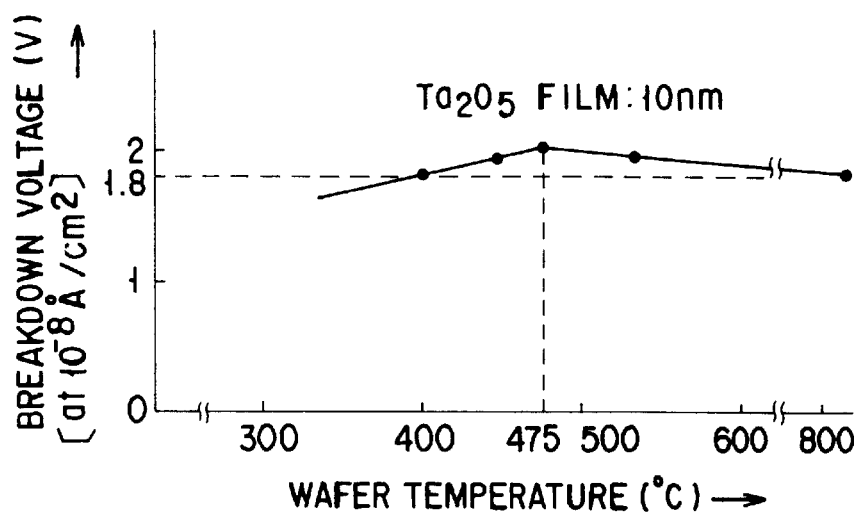
FIG. 28 is a graph showing the relationship between the wafer temperature and the breakdown voltage in the film modifying apparatus shown in FIG 26.

FIG. 26 is a view showing a film modifying apparatus 500 according to the eighth embodiment of the second aspect for performing such a modification process. FIG. 27 is a bottom view showing the shower head of the film modifying apparatus 500 shown in FIG. 26. FIG. 28 is a graph showing the relationship between the wafer temperature and the breakdown voltage in the film modifying apparatus 500 according to the eighth embodiment. The same reference numerals as in the first to seventh embodiments denote the same parts in the eighth embodiment, and a detailed description thereof will be omitted. In the eighth embodiment, only the main part will be described. The remaining portions have the same structures as in the first to seventh embodiments.

In the eighth embodiment, a plurality of heating lamps 330 constituted by, e.g., halogen lamps are used as a heating means. The heating lamps 330 are arranged under a transmission window 256 consisting of silica glass and provided at the bottom portion of a process vessel 204.

A mounting table 232 used in this embodiment is different from the thick mounting table 214 incorporating the heating resistor 220 in the first to seventh embodiments. As the mounting table 332, a carbon mounting table coated with, e.g., a very thin SiC film is used. The mounting table 332 is supported by a plurality of columns 334 consisting of silica glass and extending from the bottom portion of the process vessel 204.

A shower head 244 provided in the process vessel 204 is constituted by a distribution ring pipe 336 arranged at the peripheral portion of the process vessel 204, and a hollow disk-shaped disk head portion 340 provided at the central portion through four connection pipes 338. A number of injection holes 246 are formed in the lower surface of the head portion 340 such that a process gas can be supplied into the process vessel 204.

A distance L1 between a wafer W and the lower surface of the shower head 244 is made as small as possible, i.e., set to be about 10 mm. This structure suppresses vapor phase reaction and promotes decomposition of ozone mainly by surface reaction. A cooling jacket 272 is arranged in the side wall of the process vessel 204 such that the side wall becomes a cold wall.

In the film modifying apparatus 500 according to the eighth embodiment with the above arrangement, a process gas containing ozone and supplied to the shower head 244 flows from the distribution ring pipe 336 into the disk head portion 340 through the connection pipes 338. The process gas is uniformly supplied onto the wafer in the process vessel 204 through the large number of injection holes 246.

Heat rays emitted from the heating lamps 330 are transmitted through the transmission window 256 and irradiated on the lower surface of the mounting table 332 to heat the mounting table 332. The wafer W mounted on the mounting table 332 is indirectly heated to a predetermined temperature.

When the wafer temperature is set within the range of 400° C. to 850° C., ozone can be thermally decomposed on the wafer surface without using UV rays to generate active oxygen atoms, so that the wafer surface can be modified to improve the insulating properties of the tantalum oxide film.

Particularly, when the distance L1 between the wafer W and the shower head 244 is large, ozone injected from the shower head 244 is decomposed by vapor phase reaction midway. In this case, many generated active oxygen atoms vanish before they reach the wafer surface. In the eighth embodiment, the wafer surface and the lower surface of the shower head 244 are made close to each other to, e.g., about 10 mm. With this arrangement, ozone is decomposed mainly on the heated wafer surface, and active oxygen atoms at a very high concentration can be obtained. Therefore, the generated active oxygen atoms efficiently act on the wafer surface to allow an efficient modification process. The characteristics of the film can also be improved.

In the eighth embodiment, the side wall of the process vessel 204 is cooled by the cooling jacket 272 and maintained at a temperature lower than the thermal decomposition temperature of ozone, e.g., at 300° C. or less. With this arrangement, thermal decomposition of ozone flowing to portions other than the wafer surface can be suppressed to promote decomposition of ozone only on the wafer surface, so that the modification efficiency can be further increased.

The process gas contains ozone. $N_2O$ may be used in place of ozone.

As is apparent from the graph shown in FIG. 28, when a $Ta_2O_5$ film having a thickness of 10 nm is to be formed, the breakdown voltage becomes high at a wafer temperature of 450° C. to 500° C., and most preferably, at 475° C. When the wafer temperature is 400° C. or less, the breakdown voltage becomes 1.8 V or less, so the characteristics degrade. In addition, an insulating film having satisfactory properties can be obtained until 800° C.

When the process was performed under the conditions that the wafer temperature in the process was 400° C., the process pressure was 1 Torr, and the concentration of ozone was 150 $g/m^3$. To obtain the current vs. voltage characteristics in the 10-minute process under a reduced pressure, which are shown in FIG. 12, the process needed be performed only for 4 minutes or less, and the process could be efficiently performed.

In the eighth embodiment of the second aspect, another shower head structure, e.g., the same shower head structure as in the first embodiment shown in FIG. 9 may be used. Instead of using the heating lamps, a mounting table 214 incorporating a heating resistor 220 may be used, as in the second embodiment.

In the first to eighth embodiments, a tantalum oxide film formed on the wafer surface is modified as a metal oxide film to be modified. The metal oxide film is not limited to this, and the present invention can be applied to modify titanium oxide, zirconium oxide, barium oxide, or strontium oxide. The present invention can also be applied to form a niobium oxide film, a hafnium oxide film, an yttrium oxide film, or a lead oxide.

In the first to eighth embodiments, a semiconductor wafer is used as a target process object. However, the present invention is not limited to this and can be applied to modify a metal oxide film formed on a glass substrate or an LCD substrate.

The film forming apparatus and method according to the first aspect and the film modifying apparatus and method according to the second aspect can be combined. More specifically, a film formed on a target process object by the film forming apparatus according to the first aspect can be modified by the film modifying apparatus according to the second aspect.

Figure 29:
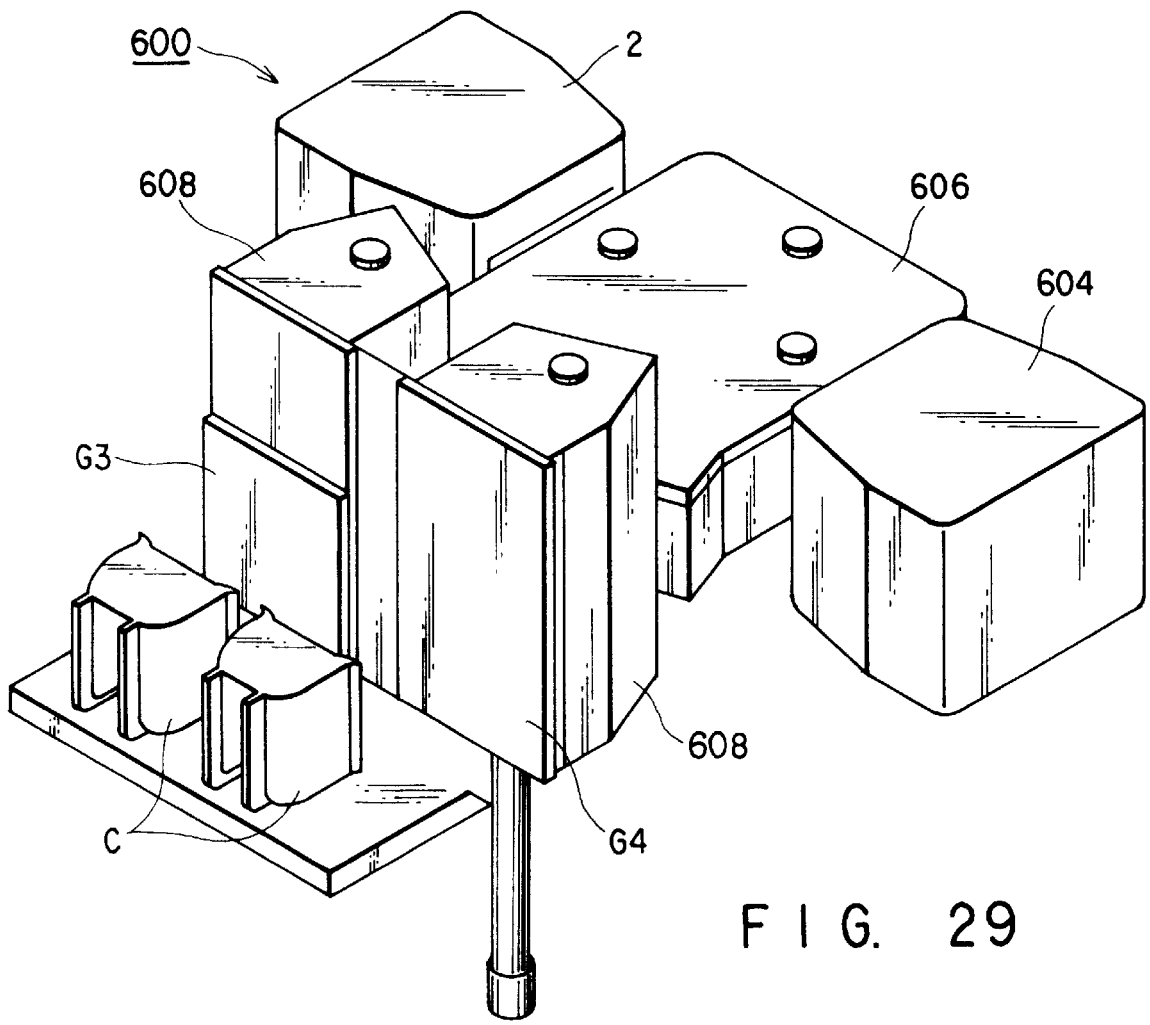
FIG. 29 is a schematic perspective view showing a film forming/modifying system according to the first embodiment of the third aspect.
Figure 30:
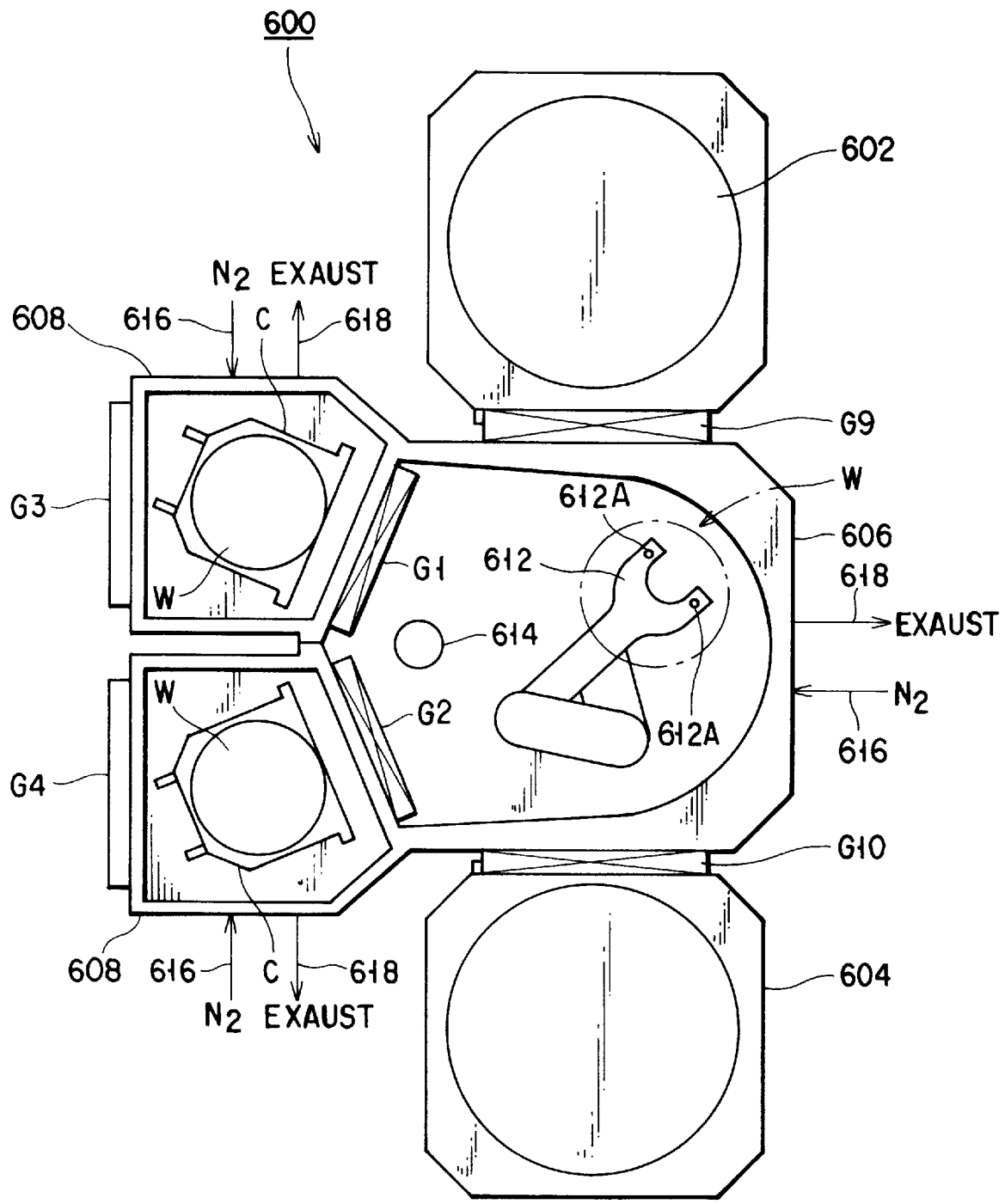
FIG. 30 is a cross-sectional view of the film forming/modifying system shown in FIG. 29.

FIG. 29 is a schematic perspective view showing a film forming/modifying system according to the first embodiment of the third aspect. FIG. 30 is a cross-sectional view of the film forming/modifying system shown in FIG. 29. FIG. 31 is a sectional view taken along the target process object conveyance route in the film forming/modifying system shown in FIG. 29.

As shown in FIG. 29, a film forming/modifying system 600 is mainly constituted by a film forming apparatus 602, a film modifying apparatus 604, and a common transfer chamber 606 for commonly coupling the two apparatuses 602 and 604. In this embodiment, to increase the wafer loading/unloading efficiency, cassette accommodation chambers 608A and 608B accommodating a cassette C capable of storing a plurality of semiconductor wafers, which can be vacuum-evacuated, are coupled to the common transfer chamber 606, so that a so-called cluster tool is formed.

The film modifying apparatus 604 has the same arrangement as that of the film forming apparatus 2 according to the first aspect shown in FIG. 1. The film forming apparatus 604 forms a metal oxide film on, e.g., a semiconductor wafer in a vacuum atmosphere in which a vaporized metal oxide film material and a vaporized alcohol exist. The film forming apparatus 602 may be the film forming apparatus 4' shown in FIG. 7, as a matter of course.

The film modifying apparatus 604 modifies the metal oxide film formed on the target process object in the film forming apparatus 602 by exposing the metal oxide film to active oxygen atoms in a vacuum atmosphere. The film modifying apparatus 604 has the same arrangement as that of the film modifying apparatus 200 according to the first embodiment of the second aspect shown in FIG. 9. The film modifying apparatus 604 may be the film modifying apparatus according to any one of the second to eighth embodiments of the second aspect.

As described above, the common transfer chamber 606 commonly couples the film forming apparatus 602 and the film modifying apparatus 604. The arrangement will be described below in detail. As shown in FIG. 30, the first and second cassette accommodation chambers 608A and 608B are connected to one side surface portion of the common transfer chamber 606 through gate valves G1 and G2, respectively. The cassette accommodation chambers 608A and 608B constitute the wafer loading and unloading ports of the entire system. Each cassette accommodation chamber has a cassette stage 610 capable of moving upward/downward, as shown in FIG. 31.

The common transfer chamber 606 and the cassette accommodation chambers 608A and 608B have a hermetic structure. The cassette accommodation chambers 608A and 608B respectively have gate doors G3 and G4 which can open the cassette accommodation chambers 608A and 608B to the outer atmosphere in the operation room.

As shown in FIG. 30, the common transfer chamber 606 incorporates a transfer arm mechanism 612. The transfer arm mechanism 612 is constituted by a flexible and turnable multi-articulated arm to transfer a wafer among the cassette accommodation chambers 608A and 608B, the film forming apparatus 602, and the film modifying apparatus 604 and between the film forming apparatus 602 and the film modifying apparatus 604. For this purpose, a suction hole 612A for chucking/holding a wafer W is formed at the distal end of the arm, i.e., the wafer holding portion of the arm mechanism 612. The suction hole 612A is connected to a vacuum pump through a pipe (not shown).

The common transfer chamber 606 also incorporates a rotary stage 614 for aligning the center and the orientation flat of the semiconductor wafer W. An positioning means is constituted by a light-emitting portion and a light-receiving portion (neither are shown).

The common transfer chamber 606 has gate valves G9 and G10. The gate valve G9 is coupled to a wafer loading/unloading port 106 formed in the side wall of a process vessel 46 (FIG. 2) of the film forming apparatus 602. The gate valve G10 is coupled to a wafer loading/unloading port 274 formed in the side wall of a process vessel 204 (FIG. 9) of the film modifying apparatus 604.

Each of the above-described common transfer chamber 606 and cassette accommodation chambers 608A and 608B is connected to an $N_2$ gas supply system 616 for purging an inert gas, e.g., $N_2$ gas in each chamber and a vacuum evacuation system 618 for vacuum-evacuating the atmosphere in the chamber, so that these chambers can be independently controlled.

In the film forming/modifying system 600 according to the third aspect with the above arrangement, the cassette C in which, e.g., 25 wafers W which have not been processed yet are stored is mounted on the cassette stage 610 in the cassette accommodation chamber 608A. Subsequently, the gate door G3 is closed to set an inert gas atmosphere of $N_2$ gas in the chamber.

The gate valve G1 is opened, and the wafer W in the cassette C is vacuum-chucked by the transfer arm mechanism 612 in the common transfer chamber 606. The wafer is introduced into the common transfer chamber 606 which is set in an inert gas atmosphere in advance. The wafer W is mounted on the rotary stage 614, thereby aligning the orientation flat and centering the wafer W.

The common transfer chamber 606 is evacuated to a degree of vacuum of about 0.1 to 0.2 Torr. The wafer W is introduced into the film forming apparatus 602 through the gate valve G9 to form a film. In the film forming apparatus 602, a metal oxide film is formed on the surface of the wafer W, as in the first embodiment of the first aspect.

The wafer W on which the metal oxide film such as a $Ta_2O_5$ film is formed is transferred by the transfer arm mechanism 612 from the film forming apparatus 602 to the common transfer chamber 606 which is maintained in the vacuum state. The wafer W is introduced into the film modifying apparatus 604 which is set in a vacuum state in advance through the gate valve G10. The metal oxide film is modified according to the same procedures as in the first embodiment of the second aspect.

During this modification process, the next wafer W which has not been processed yet is introduced into the film forming apparatus 602 such that the film formation process is simultaneously performed.

When the metal oxide film on the surface of the wafer W is modified in the film modifying apparatus 604, the processed wafer W is extracted from the film modifying apparatus 604 by the transfer arm mechanism 612. After the gate valve G10 is closed, $N_2$ gas is purged in the common transfer chamber 606 to adjust the pressure.

After pressure adjustment, the processed wafer W is stored in the cassette C in the second cassette accommodation chamber 608B, in which wafers which have undergone the process are stored.

As described above, the film forming apparatus 602 and the film modifying apparatus 604 are coupled through the common transfer chamber 606 such that the wafer W which has undergone the film formation process is directly transferred to the film modifying apparatus 604 through the vacuum atmosphere. During this transfer operation, almost no pressure adjustment time is required. Therefore, the film formation process can smoothly shift to the modification process. Accordingly, the process time for the film formation/modifying process can be shortened to improve the throughput.

In this embodiment, the film formation process itself and the modification process itself can be performed in a shorter time, as described above. Accordingly, the time required for the entire film forming/modifying process can be largely shortened, so that the throughput can be largely increased.

In the above description, the film forming apparatus according to the first aspect and the film modifying apparatus according to the second aspect are combined. However, the first and second aspects can be independently practiced, as a matter of course. More specifically, the first aspect also incorporates a case wherein the modification process is not performed for the target process object on which a film is formed according to the first aspect, or a case wherein a modification process different from that of the second aspect is performed. The second aspect also incorporates a case wherein a target process object on which a film is formed by a method different from that of the first aspect is subjected to the modification process according to the second aspect.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming apparatus for forming a metal oxide film on a surface of a target process object, comprising:
   a process vessel;
   a mounting table which is accommodated in said process vessel and on which said target process object is to be mounted;
   material supply means for supplying a vaporized metal oxide film material into said process vessel;
   alcohol supply means for supplying a vaporized alcohol into said process vessel;
   a vacuum evacuation system for vacuum-evacuating said process vessel; and
   a modification process unit for modifying said metal oxide film formed on said surface of said target process object.

2. An apparatus according to claim 1, wherein said material supply means and said alcohol supply means mix the vaporized metal oxide film material with the vaporized alcohol and supply the mixture to said process vessel.

3. An apparatus according to claim 1, wherein said material supply means and said alcohol supply means independently supply the metal oxide film material and the vaporized alcohol to said process vessel.

4. An apparatus according to claim 1, wherein the metal oxide film material is a metallic alkoxide.

5. An apparatus according to claim 1, wherein said metal oxide film is formed of one material selected from the group consisting of tantalum oxide, titanium oxide, zirconium oxide, barium oxide, and strontium oxide.

6. An apparatus according to claim 1, wherein said modification process unit comprises another process vessel, a mounting table which is accommodated in said another process vessel and on which said target process object is to be mounted, process gas supply means for supplying a process gas containing at least one of oxygen, ozone, and $N_2O$ gas into said another process vessel, active oxygen generation means for generating active oxygen atoms from the process gas in said another process vessel, and a vacuum evacuation system for vacuum-evacuating said another process vessel.

7. An apparatus according to claim 6, wherein said active oxygen generation means is one of UV irradiation means, plasma generation means, and target process object heating means.

8. An apparatus according to claim 6, further comprising a common transfer chamber for commonly connecting said process vessel in which said metal oxide film is formed on said target process object and said another process vessel of said modification process unit for modifying said metal oxide film.

9. A film forming apparatus for forming a metal oxide film on a surface of a target process object, comprising:
   a process vessel;
   a mounting table which is accommodated in said process vessel and on which said target process object is to be mounted;
   material supply means for supplying a vaporized metal oxide film material into said process vessel;
   alcohol supply means for supplying a vaporized alcohol into said process vessel; and
   a vacuum evacuation system for vacuum-evacuating said process vessel,
   wherein said process vessel incorporates an alcohol decomposition catalyst for promoting decomposition of the alcohol.

10. An apparatus according to claim 9, wherein the alcohol decomposition catalyst is arranged above said mounting table.

11. An apparatus according to claim 9, wherein the alcohol decomposition catalyst consists of a metal oxide.

12. A film modifying apparatus for modifying a metal oxide film on a target process object, comprising:
   a process vessel;
   a mounting table which is accommodated in said process vessel and on which said target process object is mounted;
   process gas supply means for supplying a process gas containing at least one of oxygen, ozone, and $N_2O$ gas into said process vessel;
   active oxygen generation means for generating active oxygen atoms from the process gas in an atmosphere of said process vessel;
   a vacuum evacuation system for vacuum-evacuating said process vessel, and
   a film formation process unit for forming said metal oxide film on a surface of said target process object,
   wherein said film formation process unit comprises another process vessel, a mounting table which is accommodated in said another process vessel and on which said target process object is to be mounted, material supply means for supplying a vaporized metal oxide film material into said another process vessel, alcohol supply means for supplying a vaporized alcohol in said another process vessel, and a vacuum evacuation system for vacuum-evacuating said another process vessel.

13. An apparatus according to claim 12, further comprising a common transfer chamber for commonly connecting said process vessel for forming said metal oxide film on said target process object and said another process vessel of a modification process unit for modifying said metal oxide film.

14. An apparatus according to claim 12, further comprising mounting table heating means for heating said mounting table.

15. An apparatus according to claim 12, wherein said active oxygen generation means is UV irradiation means for irradiating a UV ray in the atmosphere in said process vessel to generate the active oxygen atoms.

16. An apparatus according to claim 15, wherein said UV irradiation means comprises a mercury-sealed lamp in which mercury is sealed, microwave generation means for applying a microwave to said mercury-sealed lamp to generate the UV ray, and a reflecting mirror for condensing the generated UV ray and uniformly irradiating the UV ray on said target process object.

17. An apparatus according to claim 15, wherein said UV irradiation means is constituted by a plurality of UV lamps substantially arrayed in parallel to oppose a surface of said mounting table.

18. An apparatus according to claim 15, wherein said process gas supply means has a shower head arranged between said UV irradiation means and said mounting table, said shower head being constituted by combining a plurality of gas injection pipes with injection holes.

19. An apparatus according to claim 18, wherein said plurality of gas injection pipes are combined into a matrix shape.

20. An apparatus according to claim 18, wherein a projection area of said plurality of gas injection pipes with respect to a surface of said mounting table is smaller than 20% of a surface area of said target process object.

21. An apparatus according to claim 12, wherein said active oxygen generation means is plasma generation means for applying a microwave or a high-frequency field to the atmosphere in said process vessel to generate a plasma, thereby generating the active oxygen atoms from the process gas.

22. An apparatus according to claim 21, wherein said process gas supply means has a shower head arranged between said plasma generation means and said mounting table, said shower head being constituted by combining a plurality of gas injection pipes with injection holes.

23. An apparatus according to claim 22, wherein said plurality of gas injection pipes are combined into a matrix shape.

24. An apparatus according to claim 22, wherein a projection area of said plurality of gas injection pipes with respect to a surface of said mounting table is smaller than 20% of a surface area of said target process object.

25. An apparatus according to claim 12, wherein said active oxygen generation means is heating means for heating said target process object within a range of 400° C. to 850° C.

26. An apparatus according to claim 25, wherein said heating means is constituted by a plurality of heating lamps arranged under said mounting table.

27. An apparatus according to any one of claims 25 and 26, further comprising a cooling jacket arranged in a side wall of said process vessel to cool said side wall to a temperature lower than a thermal decomposition temperature of ozone.

28. A film modifying apparatus for modifying a metal oxide film on a target process object, comprising:

a process vessel;

a mounting table which is accommodated in said process vessel and on which said target process object is mounted;

process gas supply means for supplying a process gas containing at least one of oxygen, ozone, and $N_2O$ gas into said process vessel;

active oxygen generation means for generating active oxygen atoms from the process gas in an atmosphere of said process vessel; and a vacuum evacuation system for vacuum-evacuating said process vessel, wherein said process gas supply means has a container-shaped lid with a lower open end portion to cover an upper surface of said mounting table, an introduction header unit having injection holes formed on one side of said lid, and a delivery header unit having a delivery port formed on the other side of said lid such that a gas flow is formed in a horizontal direction from said introduction header unit to said delivery header unit.

29. An apparatus according to claim 28, wherein said lid and said mounting table can be made close to or separated relative to each other in a vertical direction.

30. A film forming/modifying apparatus comprising:

a film formation process unit for forming a metal oxide film on a target process object in a vacuum atmosphere in which a vaporized metal oxide film material and a vaporized alcohol exist;

a modification process unit for exposing said metal oxide film to active oxygen atoms in the vacuum atmosphere, thereby modifying said metal oxide film; and a common transfer chamber commonly coupled to said film formation process unit and said modification process unit to transfer said target process object between said film formation process unit and said modification process unit while keeping the vacuum state.

31. An apparatus according to claim 30, further comprising a turnable and flexible transfer arm mechanism arranged in said common transfer chamber to hold and convey said target process object.

32. An apparatus according to claim 30, further comprising a cassette accommodation chamber capable of being vacuum-evacuated, said cassette accommodation chamber being coupled to said common transfer chamber and accommodating a cassette capable of storing a plurality of target process objects.

33. An apparatus according to claim 30, said film formation process unit comprises a process vessel, a mounting table which is accommodated in said process vessel and on which said target process object is to be mounted, material supply means for supplying a vaporized metal oxide film material into said process vessel, alcohol supply means for supplying a vaporized alcohol into said process vessel, and a vacuum evacuation system for vacuum-evacuating said process vessel.

34. An apparatus according to claim 33, wherein said process vessel of said film formation process unit incorporates an alcohol decomposition catalyst for promoting decomposition of the alcohol.

35. An apparatus according to claim 34, wherein the alcohol decomposition catalyst is arranged above said mounting table.

36. An apparatus according to claim 34, wherein the alcohol decomposition catalyst consists of a metal oxide.

37. An apparatus according to claim 30, wherein said modification process unit comprises a process vessel, a mounting table which is accommodated in said process vessel and on which said target process object is to be mounted, process gas supply means for supplying a process gas containing one of oxygen, ozone, and $N_2O$ gas into said process vessel, active oxygen generation means for generating active oxygen atoms from the process gas in said process vessel, and a vacuum evacuation system for vacuum-evacuating said process vessel.

38. An apparatus according to claim 37, wherein said active oxygen generation means is one of UV irradiation means, plasma generation means, and target process object heating means.

* * * * *